(12) United States Patent
Sakurai

(10) Patent No.: US 12,099,322 B2
(45) Date of Patent: Sep. 24, 2024

(54) POWER SUPPLY APPARATUS FOR PERFORMING WIRELESS COMMUNICATION BETWEEN FIRST CIRCUIT AND SECOND CIRCUIT INSULATED FROM FIRST CIRCUIT, AND IMAGE FORMING APPARATUS INCLUDING POWER SUPPLY APPARATUS

(71) Applicant: CANON KABUSHIKI KAISHA, Tokyo (JP)

(72) Inventor: Hiroyuki Sakurai, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/554,997

(22) Filed: Dec. 17, 2021

(65) Prior Publication Data
US 2022/0107600 A1  Apr. 7, 2022

Related U.S. Application Data

(63) Continuation of application No. PCT/JP2020/021917, filed on Jun. 3, 2020.

(30) Foreign Application Priority Data

Jun. 21, 2019 (JP) .................................. 2019-115905

(51) Int. Cl.
*G03G 15/00* (2006.01)
*G03G 15/20* (2006.01)
(Continued)

(52) U.S. Cl.
CPC ............. *G03G 15/80* (2013.01); *G03G 15/20* (2013.01); *G05F 1/455* (2013.01); *H04N 1/00888* (2013.01)

(58) Field of Classification Search
USPC ........................................................... 399/88
See application file for complete search history.

(56) References Cited

U.S. PATENT DOCUMENTS

| 2003/0063032 | A1* | 4/2003 | Usui ...................... H01Q 21/28 343/702 |
| 2019/0163114 | A1 | 5/2019 | Ishikawa |
| 2020/0096920 | A1* | 3/2020 | Ishikawa ............ G03G 15/2039 |

FOREIGN PATENT DOCUMENTS

| JP | 2006302086 A | 11/2006 |
| JP | 2010074621 A | 4/2010 |

(Continued)

*Primary Examiner* — Quana Grainger
(74) *Attorney, Agent, or Firm* — Canon U.S.A., Inc. IP Division

(57) ABSTRACT

A power supply apparatus includes a first circuit, a second circuit, an adjustment unit, a detection unit configured to detect a parameter, a first communication unit, a second communication unit configured to perform wireless communication with the first communication unit, and a control unit configured to control the adjustment unit, the detection result being transmitted from the first communication unit to the second communication unit by the wireless communication. The detection unit operates with power resulting from a voltage output from the control unit to the second communication unit. The first communication unit includes first wiring, the second communication unit includes second wiring, and the first wiring is disposed to not contact the second wiring. At least a part of a region surrounded by the first wiring and the detection unit overlaps a region surrounded by the second wiring and the control unit.

27 Claims, 16 Drawing Sheets

(51) Int. Cl.
     *G05F 1/455*         (2006.01)
     *H04N 1/00*          (2006.01)

(56) References Cited

FOREIGN PATENT DOCUMENTS

| | | | | |
|---|---|---|---|---|
| JP | 2010213195 A | | 9/2010 | |
| JP | 2012105477 A | | 5/2012 | |
| JP | 2014074766 A | | 4/2014 | |
| JP | 2018113500 A | * | 7/2018 | |
| JP | 2019004691 A | | 1/2019 | |
| JP | WO2018008338 A1 | | 2/2019 | |
| JP | 2021001983 A | * | 1/2021 | ............ G03G 15/20 |
| WO | 2018008338 A1 | | 1/2018 | |

* cited by examiner

POWER SUPPLY APPARATUS FOR PERFORMING WIRELESS COMMUNICATION BETWEEN FIRST CIRCUIT AND SECOND CIRCUIT INSULATED FROM FIRST CIRCUIT, AND IMAGE FORMING APPARATUS INCLUDING POWER SUPPLY APPARATUS

CROSS-REFERENCE TO RELATED APPLICATIONS

This application is a Continuation of International Patent Application No. PCT/JP2020/021917, filed Jun. 3, 2020, which claims the benefit of Japanese Patent Application No. 2019-115905, filed Jun. 21, 2019, both of which are hereby incorporated by reference herein in their entireties.

BACKGROUND OF THE INVENTION

Field of the Invention

The present invention relates to a power supply apparatus and an image forming apparatus that control power supplied to a load.

Background Art

An apparatus that operates with power supplied from a commercial power source and is configured so that the voltage of the commercial power source input to a primary side and a current flowing through the primary side are detected on a secondary side insulated from the primary side has conventionally been known.

Japanese Patent Application Laid-Open No. 2014-074766 discusses an image forming apparatus configured so that a voltage applied to a fixing heater disposed on a primary side of a transformer is detected on a secondary side via the transformer. A central processing unit (CPU) controls the temperature of the fixing heater based on the detection result.

In Japanese Patent Application Laid-Open No. 2014-074766, the transformer has a function of insulating the primary side and the secondary side from each other, and a function of transforming the voltage on the primary side and outputting the transformed voltage to the secondary side. The lower the frequency of the voltage to be transformed, the greater number of turns of the transformer and the greater size of the transformer may be desirable.

The voltage to be transformed in Japanese Patent Application Laid-Open No. 2014-074766 has a frequency as relatively low as 50 Hz or 60 Hz. In other words, according to Japanese Patent Application Laid-Open No. 2014-074766, the use of the transformer increases the size and cost of the image forming apparatus.

CITATION LIST

Patent Literature

PTL 1: Japanese Patent Laid-Open No. 2014-074766

SUMMARY OF THE INVENTION

The present invention is directed to preventing an increase in apparatus size while maintaining a first circuit and a second circuit insulated, and controlling power supplied to a load connected to the first circuit.

According to an aspect of the present invention, a power supply apparatus includes a first circuit connected to a predetermined power supply, a second circuit insulated from the first circuit, an adjustment unit included in the first circuit and configured to adjust power supplied from the predetermined power supply to a load connected to the first circuit, a detection unit included in the first circuit and configured to detect a parameter related to the power supplied from the predetermined power supply to the load, a first communication unit included in the first circuit and connected to the detection unit, a second communication unit included in the second circuit, insulated from the first communication unit, and configured to perform wireless communication with the first communication unit, and a control unit included in the second circuit and configured to control the adjustment unit based on a detection result of the detection unit, the detection result being transmitted from the first communication unit to the second communication unit by the wireless communication, wherein the detection unit is configured to operate with power resulting from a voltage generated in the first communication unit due to a voltage output from the control unit to the second communication unit, wherein the first communication unit includes first wiring constituting a first antenna configured to perform the wireless communication, the first wiring electrically connecting a first connection portion of the detection unit and a second connection portion of the detection unit, wherein the second communication unit includes second wiring constituting a second antenna configured to perform the wireless communication, the second wiring electrically connecting a third connection portion of the control unit and a fourth connection portion of the control unit, wherein the first wiring is disposed to not contact the second wiring, and wherein at least a part of a region surrounded by the first wiring and the detection unit overlaps a region surrounded by the second wiring and the control unit in a case where a circuit substrate is seen along a direction perpendicular to a surface of the circuit substrate where the detection unit is disposed.

According to the present invention, an increase in apparatus size can be avoided while maintaining the first circuit and the second circuit insulated, and the power supplied to the load connected to the first circuit can be controlled.

Further features of the present invention will become apparent from the following description of exemplary embodiments with reference to the attached drawings.

DESCRIPTION OF THE EMBODIMENTS

Exemplary embodiments of the present invention will be described below with reference to the drawings. It should be noted that the shapes and relative arrangement of components described in the exemplary embodiments are subject to appropriate changes depending on the configurations and various conditions of apparatuses to which the invention is applied, and the scope of the invention is not intended to be limited to the following exemplary embodiments.

Image Forming Apparatus

Figure 1:
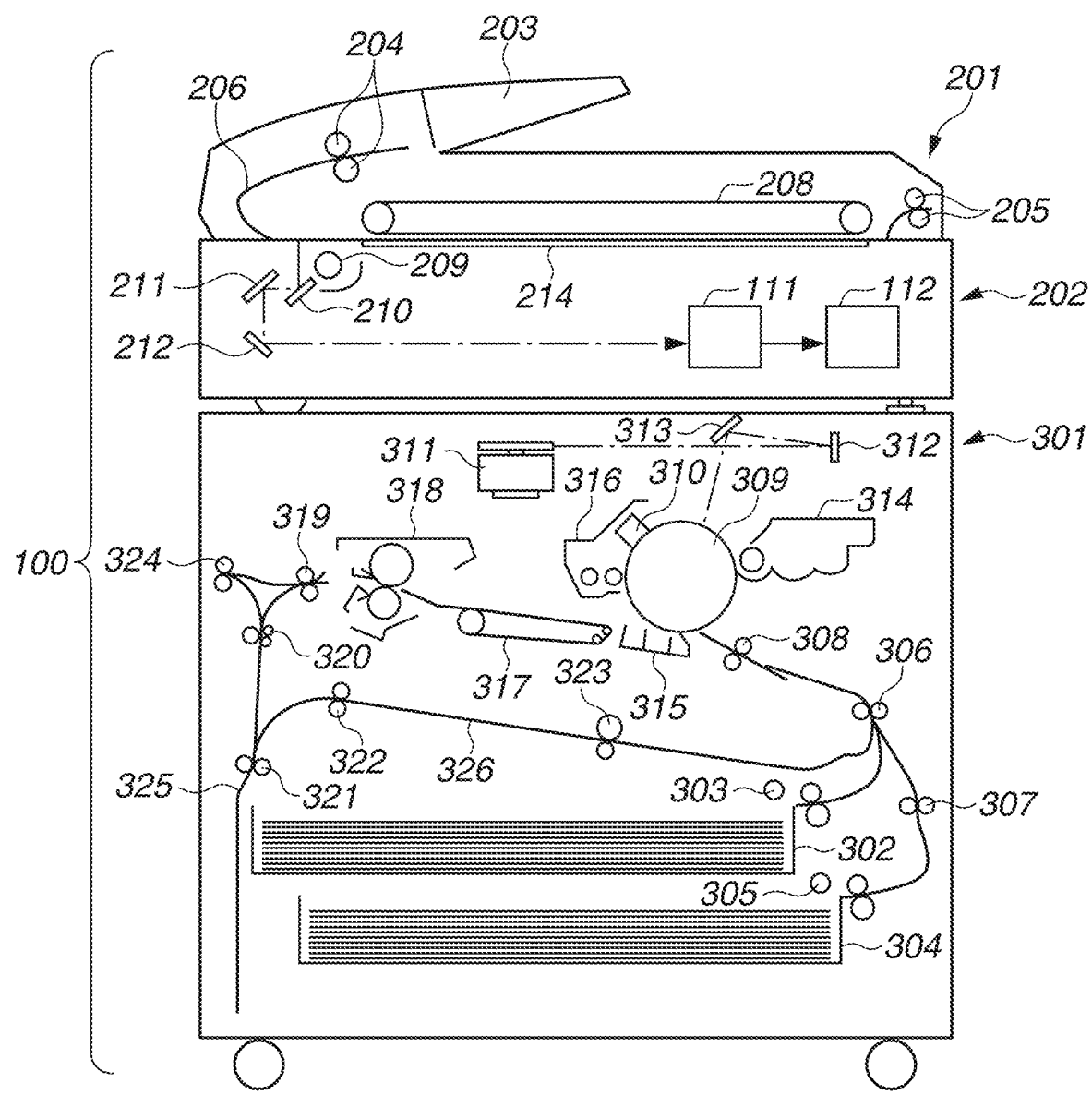
FIG. 1 is a sectional view illustrating an image forming apparatus according to a first exemplary embodiment.

FIG. 1 is a sectional view illustrating a configuration of a monochrome electrophotographic copying machine (hereinafter, referred to as an image forming apparatus) 100 including a sheet conveyance device used in a first exemplary embodiment. The image forming apparatus is not limited to a copying machine, and may be a facsimile apparatus, a printing machine, or a printer, for example. The recording method is not limited to the electrophotographic method, and may be an inkjet method, for example. Moreover, the image forming apparatus may be either a monochrome or color image forming apparatus.

The configuration and functions of the image forming apparatus 100 will be described below with reference to FIG. 1. As illustrated in FIG. 1, the image forming apparatus 100 includes a document feeding apparatus 201, a reading apparatus 202, and an image printing apparatus 301.

Documents stacked on a document stacking unit 203 of the document feeding apparatus 201 are fed out by feed rollers 204 one by one, and conveyed onto a document glass plate 214 of the reading apparatus 202 along a conveyance guide 206. The document is further conveyed at a constant speed by a conveyance belt 208 and discharged to a not-illustrated discharge tray by discharge rollers 205. Reflection light from a document image illuminated at a reading position of the reading apparatus 202 by an illumination system 209 is guided through an optical system including reflection mirrors 210, 211, and 212 to an image reading unit 111, and converted into an image signal by the image reading unit 111. The image reading unit 111 includes a lens, a charge-coupled device (CCD) sensor, which is a photoelectric conversion element, and a drive circuit of the CCD sensor. The image signal output from the image reading unit 111 is given various types of correction processing by an image processing unit 112 including a hardware device such as an application-specific integrated circuit (ASIC), and then output to the image printing apparatus 301. Documents are read in such a manner. In other words, the document feeding apparatus 201 and the reading apparatus 202 function as a document reading apparatus.

The document reading apparatus has a first reading mode and a second reading mode as its document reading modes. The first reading mode is a mode where the image of a document conveyed at a constant speed is read by using the illumination system 209 and the optical system that are fixed at a predetermined position. The second reading mode is a mode where the image of a document placed on the document glass plate 214 of the reading apparatus 202 is read by using the illumination system 209 and the optical system that move at a constant speed. The image of a sheet-like document is usually read in the first reading mode, and the image of a bound document, such as a book and a booklet, is read in the second reading mode.

The image printing apparatus 301 includes sheet storage trays 302 and 304 inside. The sheet storage trays 302 and 304 can store respective different types of recording media. For example, the sheet storage tray 302 stores A4-size sheets of plain paper. The sheet storage tray 304 stores A4-size sheets of thick paper. A recording medium refers to an article on which the image forming apparatus 100 forms an image. Examples of recording media include a sheet of paper, a resin sheet, a piece of cloth, an overhead projector (OHP) sheet, and a label.

The recording media stored in the sheet storage tray 302 are fed out by a feed roller 303 and delivered to registration rollers 308 by conveyance rollers 306. The recording media stored in the sheet storage tray 304 are fed out by a feed roller 305 and delivered to the registration rollers 308 by conveyance rollers 307 and the conveyance rollers 306.

The image signal output from the reading apparatus 202 is input to an optical scanning device 311 including a semiconductor laser and a polygonal mirror.

The outer peripheral surface of a photosensitive drum 309 is charged by a charging device 310. The charged outer peripheral surface of the photosensitive drum 309 is then irradiated with laser light from the optical scanning device 311 via the polygonal mirror and mirrors 312 and 313. The laser light here is based on the image signal input to the optical scanning device 311 from the reading apparatus 202. As a result, an electrostatic latent image is formed on the outer peripheral surface of the photosensitive drum 309. The photosensitive drum 309 is charged by a charging method using a corona charger or a charging roller, for example.

Next, the electrostatic latent image is developed with toner in a developing device 314, whereby a toner image is formed on the outer peripheral surface of the photosensitive drum 309. The toner image formed on the photosensitive drum 309 is transferred to a recording medium by a transfer charging device 315 located at a position (transfer position) opposed to the photosensitive drum 309. The registration rollers 308 feed the recording medium to the transfer position in synchronization with the transfer timing.

The recording medium to which the toner image is transferred as described above is fed into a fixing device 318 by a conveyance belt 317. The recording medium is heated and pressurized by the fixing device 318, whereby the toner image is fixed to the recording medium. The image forming apparatus 100 forms an image on the recording medium in such a manner.

In forming an image in a one-sided printing mode, the recording medium past the fixing device 318 is discharged to a not-illustrated discharge tray by discharge rollers 319 and 324. In forming an image in a two-sided printing mode, the recording medium is conveyed to a reversing path 325 by the discharge rollers 319, conveyance rollers 320, and reversing rollers 321 after the fixing processing on the first side of the recording medium by the fixing device 318. The recording medium is then conveyed to the registration rollers 308 again by conveyance rollers 322 and 323, and an image is formed on the second side of the recording medium by the foregoing method. The recording medium is then discharged to the not-illustrated discharge tray by the discharge rollers 319 and 324.

If the recording medium with an image formed on the first side is discharged to outside the image forming apparatus 100 face down, the recording medium past the fixing device 318 is conveyed past the discharge rollers 319 toward the conveyance rollers 320. The rotation of the conveyance rollers 320 is then reversed immediately before the trailing edge of the recording medium passes the nip portion between the conveyance rollers 320, whereby the recording medium is discharged to outside the image forming apparatus 100 via the discharge rollers 324 with the first side of the recording medium down.

The above is the description of the configuration and functions of the image forming apparatus 100.

Figure 2:
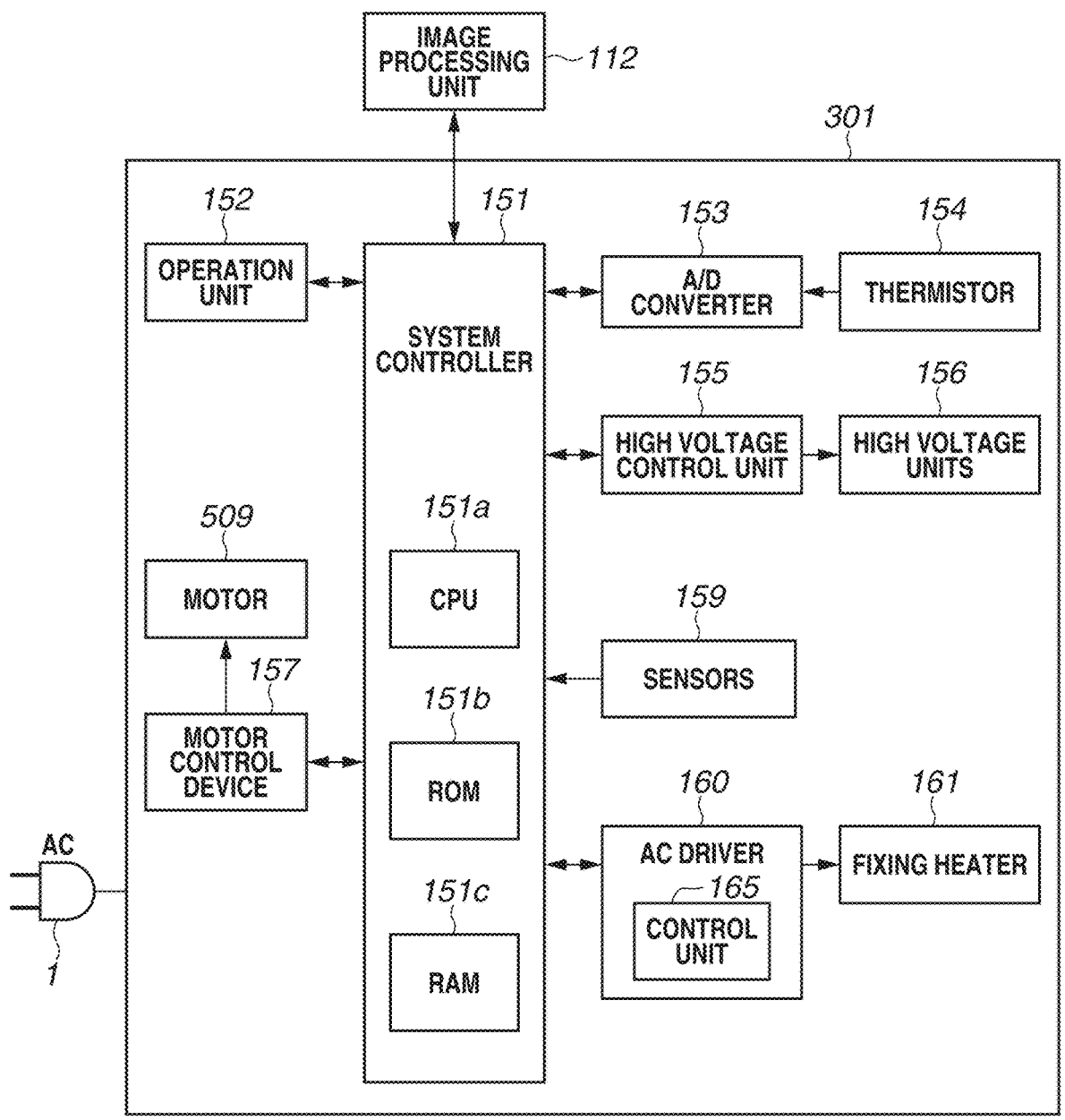
FIG. 2 is a block diagram illustrating a control configuration of the image forming apparatus according to the first exemplary embodiment.

FIG. 2 is a block diagram illustrating an example of a control configuration of the image forming apparatus 100. As illustrated in FIG. 2, the image forming apparatus 100 is connected to an alternating-current (AC) power supply 1 serving as a commercial power source. Various devices in the image forming apparatus 100 operate with power supplied from the AC power supply 1. As illustrated in FIG. 2, a system controller 151 includes a central processing unit (CPU) 151a, a read-only memory (ROM) 151b, and a random access memory (RAM) 151c. The system controller 151 is connected to the image processing unit 112, an operation unit 152, an analog-to-digital (A/D) converter 153, a high voltage control unit 155, a motor control device 157, sensors 159, and an AC driver 160. The system controller 151 can transmit and receive data and commands to and from the connected units.

The CPU 151a performs various sequences related to a predetermined image formation sequence by reading and executing various programs stored in the ROM 151b.

The RAM 151c is a storage device. The RAM 151c stores various types of data, including setting values of the high voltage control unit 155, command values for the motor control device 157, and information received from the operation unit 152.

The system controller 151 transmits setting value data on various devices included in the image forming apparatus 100 for use in the image processing by the image processing unit 112 to the image processing unit 112. The system controller 151 further receives signals from the sensors 159, and sets the setting values of the high voltage control unit 155 based on the received signals.

The high voltage control unit 155 supplies predetermined voltages to high voltage units 156 (such as the charging device 310, the developing device 314, and the transfer charging device 315) based on the setting values set by the system controller 151.

The motor control device 157 controls motors for driving loads included in the image forming apparatus 100 based on commands output from the CPU 151a. While FIG. 2 illustrates only a motor 509 as a motor of the image forming apparatus 100, the image forming apparatus 100 actually includes a plurality of motors. A single motor control device 157 may be configured to control the plurality of motors. While there is disposed only one motor control device in FIG. 2, the image forming apparatus 100 may include two or more motor control devices.

The A/D converter 153 receives a detection signal detected by a thermistor 154 for detecting the temperature of a fixing heater 161, converts the detection signal from an analog signal into a digital signal, and transmits the digital signal to the system controller 151. The system controller 151 controls the AC driver 160 based on the digital signal received from the A/D converter 153. The AC driver 160 controls the fixing heater 161 so that the temperature of the fixing heater 161 becomes a predetermined temperature for performing the fixing processing. The fixing heater 161 is a heater used for the fixing processing, and included in the fixing device 318.

The system controller 151 controls the operation unit 152 to display an operation screen on a display unit included in the operation unit 152. The operation screen is intended for the user to set the type of recording medium to be used (hereinafter, referred to as a paper type). The system controller 151 receives information set by the user from the operation unit 152, and controls an operation sequence of the image forming apparatus 100 based on the information set by the user. Moreover, the system controller 151 transmits information indicating the state of the image forming apparatus 100 to the operation unit 152. Examples of the information indicating the state of the image forming apparatus 100 include information about the number of images formed, the progress of an image forming operation, and sheet jam and double feeds in the document feeding apparatus 201 and the image printing apparatus 301. The operation unit 152 displays the information received from the system controller 151 on the display unit.

In such a manner, the system controller 151 controls the operation sequence of the image forming apparatus 100.

AC Driver

Figure 3:
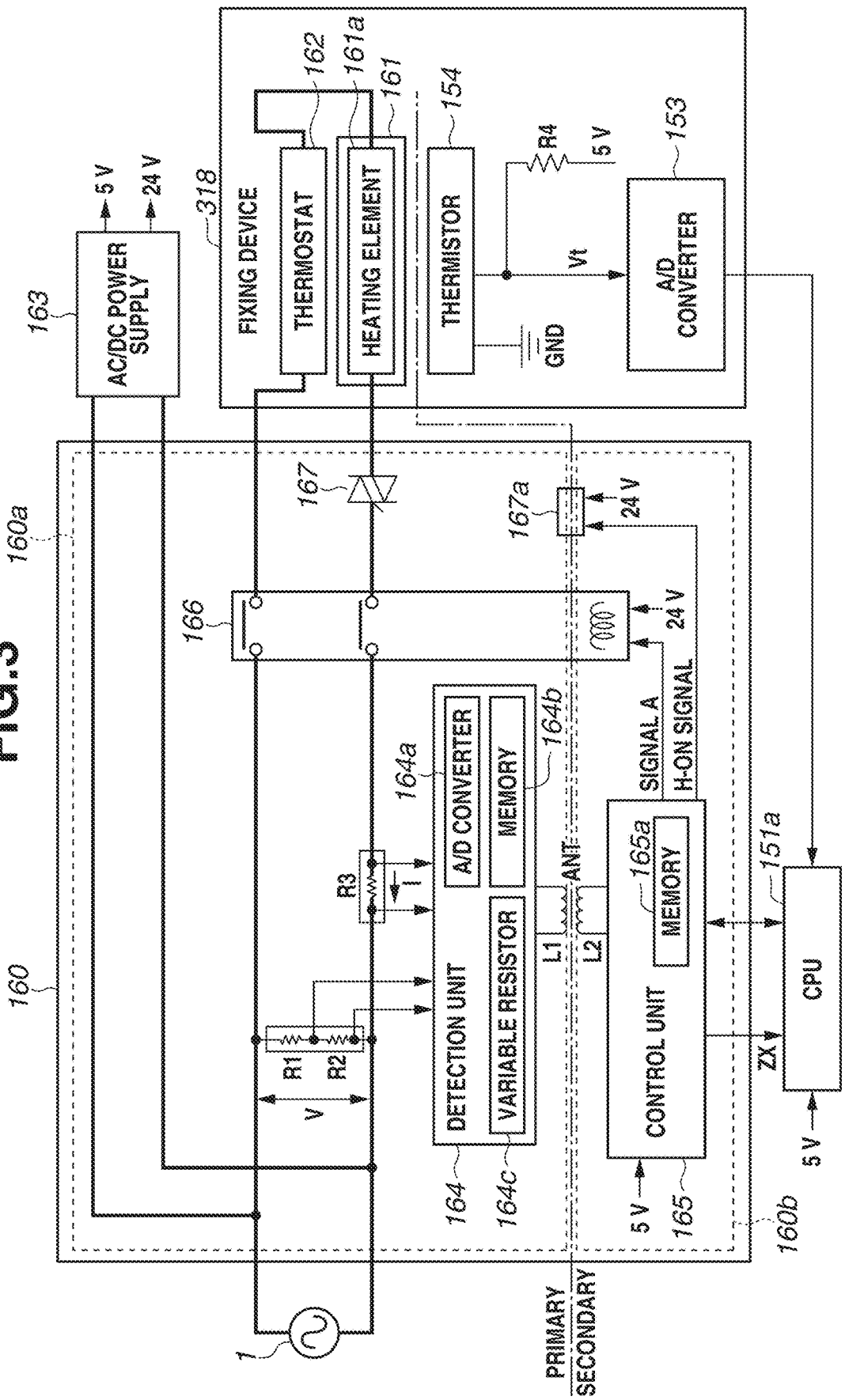
FIG. 3 is a control block diagram illustrating a configuration of an alternating-current (AC) driver according to the first exemplary embodiment.

FIG. 3 is a control block diagram illustrating a configuration of the AC driver 160. The AC driver 160 includes a first circuit 160a connected to the AC power supply 1 and a second circuit 160b insulated from the first circuit 160a. As illustrated in FIG. 3, the first circuit 160a is included in a primary side of the AC driver 160. The second circuit 160b is included in a secondary side of the AC driver 160.

The AC driver 160 includes a detection unit 164, a relay circuit 166, a triac 167, and a control unit 165. The detection unit 164 detects a voltage V supplied from the AC power supply 1 and a current I flowing through the fixing heater 161. The relay circuit 166 controls power supply from the AC power supply 1 to the fixing device 318. The control unit 165 controls the relay circuit 166 and the triac 167.

As illustrated in FIG. 3, the detection unit 164 is insulated from the control unit 165. The detection unit 164 is disposed in the first circuit 160a. The control unit 165 is disposed in the second circuit 160b. The detection unit 164 is electromagnetically coupled to the control unit 165 by an antenna ANT. The control unit 165 is connected to the CPU 151a and controlled by the CPU 151a. The antenna ANT will be described below.

As illustrated in FIG. 3, the voltage output from the AC power supply 1 is also input to an alternating-current-to-direct-current (AC/DC) power supply 163. The AC/DC power supply 163 converts the AC voltage output from the AC power supply 1 into DC voltages of, e.g., 5 V and 24 V, and outputs the DC voltages. The DC voltage of 5 V is supplied to the CPU 151a and the control unit 165. The DC voltage of 24 V is supplied to the relay circuit 166 and a triac driving circuit 167a. The DC voltages of 5 V and 24 V are also supplied to various devices in the image forming apparatus 100. Note that the voltages output from the AC/DC power supply 163 are not supplied to the detection unit 164. The detection unit 164 is powered by the control unit 165 via the antenna ANT in an isolated state. A specific configuration will be described below.

The relay circuit 166 is controlled by a signal A output from the control unit 165. For example, if the signal A='H' is output from the control unit 165, the relay circuit 166 enters a state of supplying the power from the AC power supply 1 to the fixing device 318. If the signal A='L' is output from the control unit 165, the relay circuit 166 enters a state of interrupting the power supply from the AC power supply 1 to the fixing device 318. For example, if the current flowing through the fixing heater 161 exceeds a predetermined value (i.e., at abnormal time), the signal A='L' is output to the relay circuit 166. The control unit 165 outputs the signal A based on a command from the CPU 151a.

Figure 4:
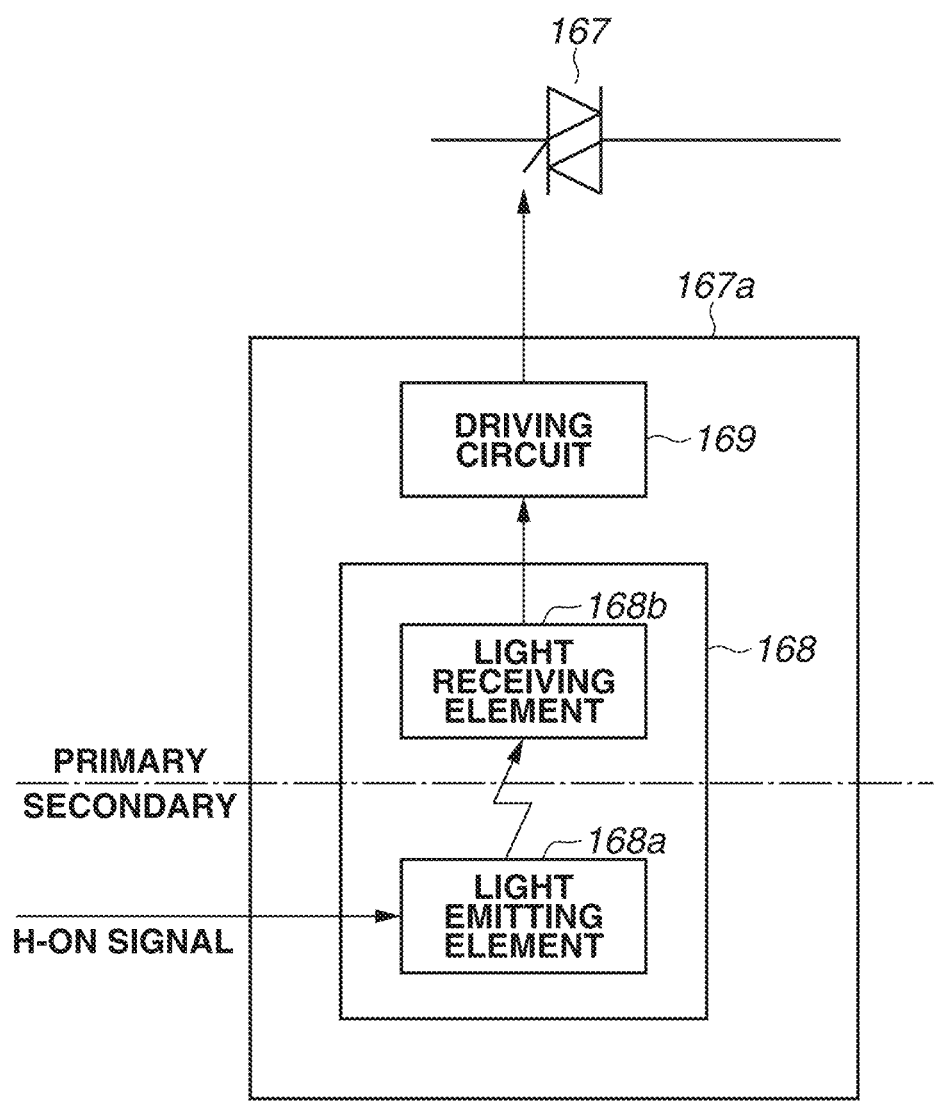
FIG. 4 is a block diagram illustrating a configuration of a triac driving circuit.

The triac driving circuit 167a is a circuit for controlling the triac 167. FIG. 4 is a block diagram illustrating a configuration of the triac driving circuit 167a. As illustrated in FIG. 4, the triac driving circuit 167a includes a photocoupler 168 and a driving circuit 169. The photocoupler 168 includes a light emitting element 168a disposed in the second circuit 160b and a light receiving element 168b disposed in the first circuit 160a. The driving circuit 169 drives the triac 167 based on the result of light reception by the light receiving element 168b.

If a heater-on (H-ON) signal='H' is output from the control unit 165, the light emitting element 168a included in the triac driving circuit 167a lights up. The light receiving element 168b provided in the triac driving circuit 167a receives the light output from the light emitting element 168a, and the driving circuit 169 in response drives the triac 167 so that the triac 167 turns on. In such a manner, the triac 167 in the first circuit 160a can be controlled by the second circuit 160b while maintaining the first and second circuits 160a and 160b insulated from each other.

The fixing heater 161 is supplied with power by controlling the triac 167 as described above. The amount of power supplied to the fixing heater 161 is adjusted by controlling the timing when the triac 167 turns on.

Temperature Control on Fixing Heater

A method for controlling the temperature of the fixing heater 161 will now be described. The power output from the AC power supply 1 is supplied to a heating element 161a inside the fixing heater 161 disposed in the fixing device 318 via the AC driver 160.

The detection unit 164 detects the voltage V supplied from the AC power supply 1 (voltage across a resistor R2). The detection unit 164 also detects the current I flowing through the heating element 161a based on a voltage across a resistor R3.

The detection unit 164 includes an A/D converter 164a that convers the input voltage V and current I from analog values into digital values. The detection unit 164 samples the voltage V and current I converted by the A/D converter 164a at a predetermined period T (for example, 50 μs). Each time the voltage V and the current I are sampled, the detection unit 164 integrates V^2, I^2, and V*I as expressed by the following Eqs. (1) to (3):

$$\Sigma (V(n))^2 \quad (1)$$

$$\Sigma I(n)^2 \quad (2)$$

$$\Sigma V(n)I(n) \quad (3)$$

The detection unit 164 stores the integrated values in a memory 164b.

The detection unit 164 also detects timing at which the voltage V changes from a negative value to a positive value (hereinafter, referred to as zero cross timing).

At the zero cross timing, the detection unit 164 calculates the effective value Vrms of the voltage V, the effective value Irms of the current I, and the effective value Prms of V*I (=P) by using the following Eqs. (4) to (6):

$$Vrms = \sqrt{\frac{1}{N} \sum_{n=1}^{N} V(n)^2} \quad (4)$$

$$Irms = \sqrt{\frac{1}{N} \sum_{n=1}^{N} I(n)^2} \quad (5)$$

$$P = \frac{1}{N} \sum_{n=1}^{N} V(n)\, I(n) \quad (6)$$

The detection unit 164 stores the calculated effective values Vrms, Irms, and Prms in the memory 164b. The detection unit 164 resets the integrated values of V^2, I^2, and V*I stored in the memory 164b each time the effective values Vrms, Irms, and Prms are calculated.

At the zero cross timing, the detection unit 164 notifies the control unit 165 of the effective values Vrms, Irms, and Prms stored in the memory 164b and the zero cross timing via the antenna ANT by a method to be described below.

The control unit 165 stores the effective values Vrms, Irms, and Prms obtained from the detection unit 164 in a memory 165a. In addition, the control unit 165 notifies the CPU 151a of the zero cross timing (signal ZX).

When notified of the zero cross timing by the control unit 165, the CPU 151a obtains the effective values Vrms, Irms, and Prms stored in the memory 165a of the control unit 165. In such a manner, the CPU 151a obtains the effective values Vrms, Irms, and Prms at each zero cross timing. In other words, in the present exemplary embodiment, the signal ZX serves as a trigger for the CPU 151a to obtain the effective values Vrms, Irms, and Prms.

The fixing device 318 includes a thermostat 162. The thermostat 162 has a function of interrupting the supply of power to the heating element 161a when the thermostat 162 reaches a predetermined temperature.

The thermistor 154 for detecting the temperature of the fixing heater 161 is located near the fixing heater 161. As illustrated in FIG. 3, the thermistor 154 is connected to ground (GND). The thermistor 154 has a characteristic of decreasing in resistance with increasing temperature, for example. A voltage Vt across the thermistor 154 also changes as the temperature of the thermistor 154 changes. The temperature of the fixing heater 161 is detected by detecting the voltage Vt.

The voltage Vt that is an analog signal output from the thermistor 154 is input to the A/D converter 153. The A/D converter 153 converts the voltage Vt from an analog signal into a digital signal, and outputs the digital signal to the CPU 151a.

The CPU 151a controls the temperature of the fixing heater 161 by controlling the triac 167 via the control unit 165 based on the effective values Vrms, Irms, and Prms obtained from the control unit 165 and the voltage Vt output from the A/D converter 153. A specific method for controlling the temperature of the fixing heater 161 will now be described.

Figure 5:
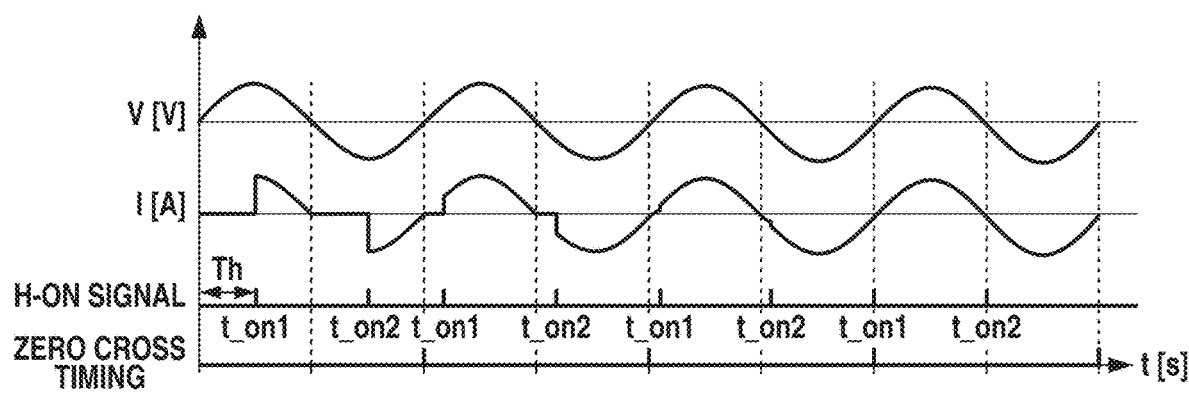
FIG. 5 is a timing chart illustrating a voltage V of an AC power supply, a current I flowing through a heating element, a heater-on (H-ON) signal output from a control unit, and zero cross timing.

FIG. 5 is a timing chart illustrating the voltage V of the AC power supply 1, the current I flowing through the heating element 161a, the H-ON signal output from the control unit 165, and the zero cross timing. As illustrated in FIG. 5, the zero cross timing has a period Tzx corresponding to the period of the AC power supply 1.

As illustrated in FIG. 5, the amount of current flowing through the heating element 161a (the amount of power supplied) is controlled by controlling a time Th from the zero cross timing to timing t_on1 when the H-ON signal='H' is output. Specifically, for example, the shorter the time Th, the higher the amount of current flowing through the heating element 161a. In other words, if the time Th is controlled to decrease, the temperature of the fixing heater 161 increases.

In the present exemplary embodiment, the CPU 151a controls the amount of current flowing through the heating element 161a by controlling the time from the zero cross timing to the timing t_on1 via the control unit 165. As a result, the CPU 151a can control the temperature of the fixing heater 161. In the present exemplary embodiment, the triac 167 is controlled so that the same amount as and opposite polarity to those of the current flowing due to the output of the H-ON signal='H' at the timing t_on1 also flows through the heating element 161a. Specifically, as illustrated in FIG. 5, the H-ON signal='H' is also output at timing t_on2 after a lapse of time Tzx/2 from the timing t_on1 (i.e., at timing after one half cycle of the voltage of the AC power supply 1).

Figure 6:
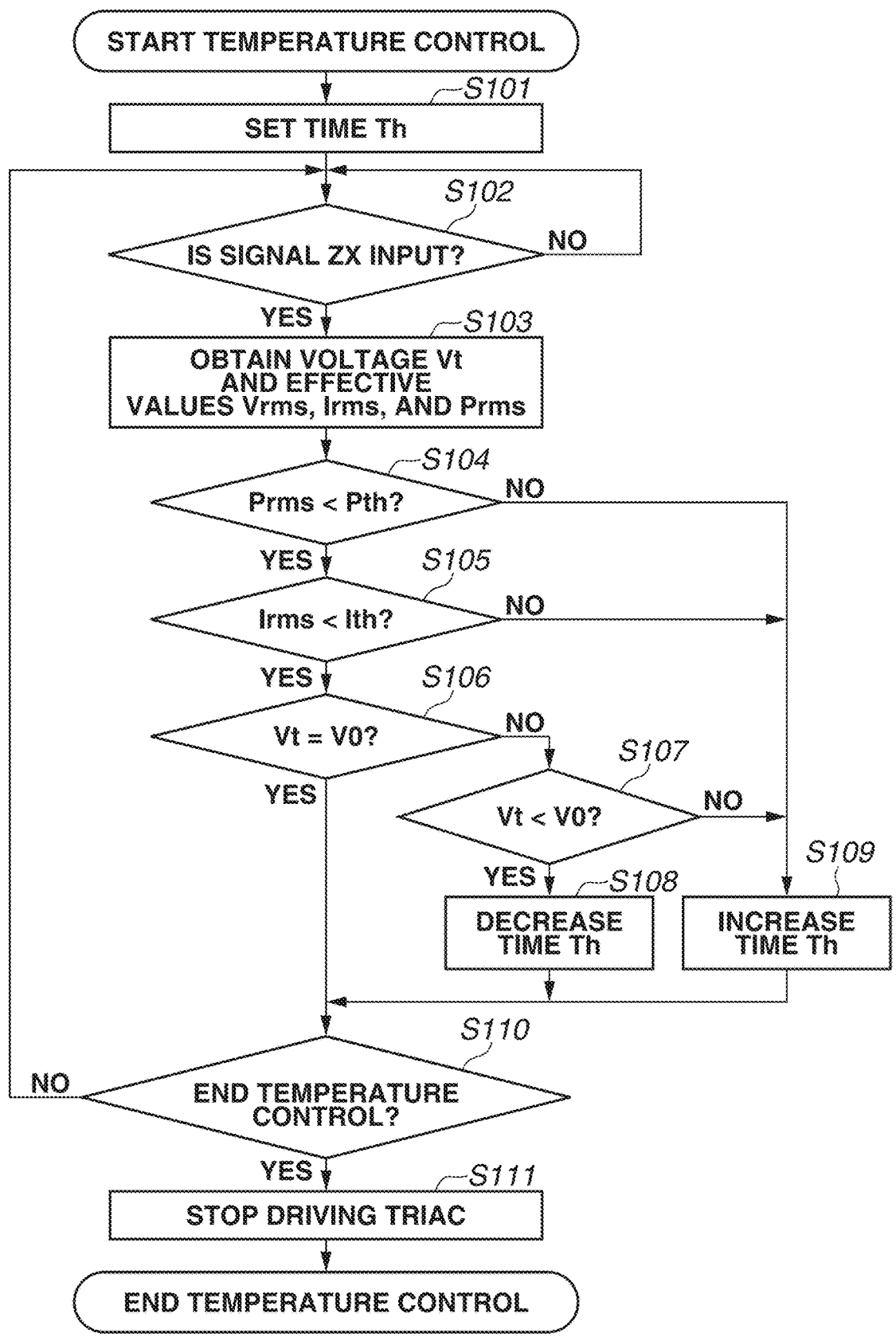
FIG. 6 is a flowchart illustrating a method for controlling the temperature of a fixing heater according to the first exemplary embodiment.

FIG. 6 is a flowchart illustrating the method for controlling the temperature of the fixing heater 161. The temperature control of the fixing heater 161 in the present exemplary embodiment will now be described with reference to FIG. 6. The processing of this flowchart is performed by the CPU 151a. The processing of this flowchart is performed when the image forming apparatus 100 is activated, for example.

In step S101, the CPU 151a sets the time Th based on a difference value between the voltage Vt obtained from the A/D converter 153 and a voltage V0 corresponding to the target temperature of the fixing heater 161, for example, and notifies the control unit 165 of the time Th. As a result, the control unit 165 outputs the H-ON signal to the triac driving circuit 167a based on the set time Th.

In step S102, if the signal ZX is input to the CPU 151a from the control unit 165 (YES in step S102), the processing proceeds to step S103. In step S103, the CPU 151a obtains the voltage Vt output from the A/D converter 153 and the effective values Vrms, Irms, and Prms stored in the memory 165a of the control unit 165.

In step S104, if the effective value Prms of the power is greater than or equal to a threshold Pth (Prms≥Pth) (NO in step S104), the processing proceeds to step S109. In step S109, the CPU 151a outputs an instruction to increase the currently set time Th to the control unit 165. The time Th may be increased by a predetermined amount. The amount of increase of the time Th may be determined based on a difference value between the effective value Prms and the threshold Pth.

As described above, if the effective value Prms of the power is greater than or equal to the threshold Pth, the time Th is set so that the effective value Prms falls below the threshold Pth. This can prevent excessive power supply to the fixing heater 161. As a result, an increase in the power consumption can be reduced. Note that the threshold Pth is set to a value greater than the power that can increase the temperature of the fixing heater 161 to the target temperature.

The processing then proceeds to step S110.

In step S104, if the effective value Prms of the power is less than the threshold Pth (Prms<Pth) (YES in step S104), the processing proceeds to step S105.

In step S105, if the effective value Irms of the current is greater than or equal to a threshold Ith (Irms≥Ith) (NO in step S105), the processing proceeds to step S109. In step S109, the CPU 151a outputs an instruction to increase the currently set time Th to the control unit 165. The time Th may be increased by a predetermined amount. The amount of increase of the time Th may be determined based on a difference value between the effective value Irms and the threshold Ith.

As described above, if the effective value Irms of the current is greater than or equal to the threshold Ith, the time Th is control so that the effective value Irms falls below the threshold Ith. This can prevent excessive current from being supplied to the heating element 161a. As a result, an excessive increase in the temperature of the fixing heater 161 can be avoided. Note that the threshold Ith is set to a value greater than the current that can increase the temperature of the fixing heater 161 to the target temperature.

The processing then proceeds to step S110.

In step S105, if the effective value Irms is less than the threshold Ith (Irms<Ith) (YES in step S105), the processing proceeds to step S106.

In step S106, if the voltage Vt obtained from the A/D converter 153 is equal to the voltage V0 corresponding to the target temperature of the fixing heater 161 (YES in step S106), the processing proceeds to step S110.

In step S106, if the voltage Vt obtained from the A/D converter 153 is not equal to the voltage V0 corresponding to the target temperature of the fixing heater 161 (NO in step S106), the processing proceeds to step S107.

In step S107, if the voltage Vt is higher than or equal to the voltage V0 (NO in step S107), the processing proceeds to step S109. In step S109, the CPU 151a outputs an instruction to increase the currently set time Th to the control unit 165 so that a deviation between the voltages Vt and V0 decreases. The time Th may be increased by a predetermined amount. The amount of increase of the time Th may be determined based on the difference value between the voltages V0 and Vt.

In step S107, if the voltage Vt is lower than the voltage V0 (YES in step S107), the processing proceeds to step S108. In step S108, the CPU 151a outputs an instruction to decrease the currently set time Th to the control unit 165 so that a deviation between the voltage Vt and the voltage V0 decreases. The time Th may be decreased by a predetermined amount. The amount of decrease of the time Th may be determined based on the difference value between the voltages V0 and Vt.

In step S110, if the temperature control continues (i.e., the print job continues) (NO in step S110), the processing returns to step S102.

In step S110, if the temperature control ends (i.e., the print job ends) (YES in step S110), the processing proceeds to step S111. In step S111, the CPU 151a controls the control unit 165 to stop driving the triac 167.

For example, the amount of change in power due to an increase in the time Th varies between when the effective value of the voltage is 100 V and when the effective value is 80 V. Specifically, the amount of change in power due to an increase in the time Th when the effective value of the voltage is 100 V is greater than the amount of change in power due to the increase in the time Th when effective value of the voltage is 80 V. The CPU 151a controls the time Th based on the effective value Vrms of the voltage.

The method for controlling the temperature of the fixing heater 161 has been described above.

Antenna ANT

Power Supply from Control Unit to Detection Unit

The detection unit 164 disposed in the first circuit 160a is insulated from the control unit 165 disposed in the second circuit 160b, and electromagnetically coupled to the control unit 165 by the antenna ANT. The antenna ANT includes a coil (winding) L1 serving as a first communication unit and a coil (winding) L2 serving as a second communication unit. The control unit 165 outputs an amplitude-modulated high frequency (for example, 13.56-MHz) signal to the coil L2. An AC current corresponding to the signal flows through the coil L2, and an AC voltage is generated in the coil L1 by an AC magnetic field generated in the coil L2 due to the flow of the AC current. The detection unit 164 operates with the AC voltage generated in the coil L1. In the present exemplary embodiment, the detection unit 164 is thus powered by the control unit 165 via the antenna ANT. Since the first circuit 160a does not need a power supply for operating the detection unit 164, an increase in apparatus size and cost can be avoided. For example, the control unit 165 supplies power to the detection unit 164 in a shorter period than that at which the detection unit 164 detects the voltage V and the current I. Moreover, the control unit 165 does not need to supply power to the detection unit 164 in a period during which the image forming apparatus 100 sleeps.

Data Communication Between Control Unit and Detection Unit

Figure 7:
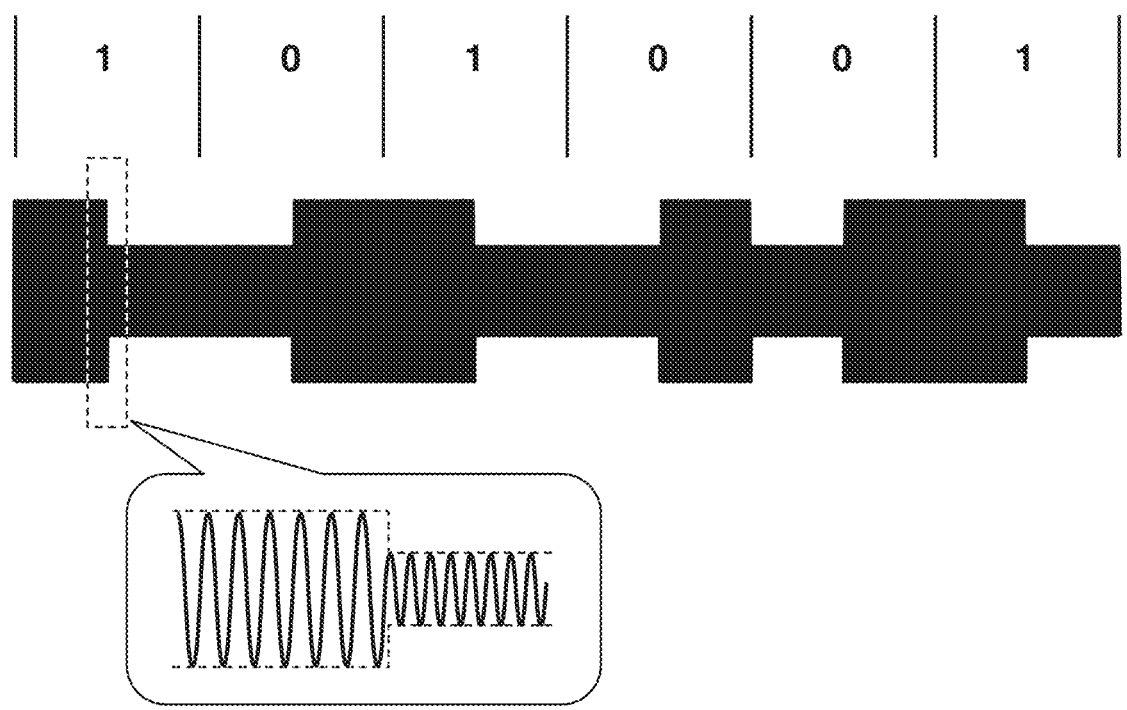
FIG. 7 is a diagram illustrating a modulated wave that is amplitude-modulated.

FIG. 7 is a diagram illustrating the amplitude-modulated signal. As illustrated in FIG. 7, a signal representing '0' and '1' is expressed by a combination of a signal having a first amplitude and a signal having a second amplitude smaller than the first amplitude. For example, the first half of one bit of a signal expressing '1' is expressed by the signal having the first amplitude, and the second half of the one bit is expressed by the signal having the second amplitude. The first half of one bit of a signal expressing '0' is expressed by the signal having the second amplitude, and the second half of the one bit is expressed by the signal having the first amplitude.

An amplitude-modulated signal such as illustrated in FIG. 7 is output to the coil L2. As a result, a signal corresponding to the signal output to the coil L2 is generated in the coil L1.

The detection unit 164 changes the resistance of the variable resistor 164c provided in the detection unit 164 based on data to be transmitted to the control unit 165, for example. As a result, the signal generated in the coil L1 changes due to a change in the impedance of the coil L1, whereby the data is transmitted to the control unit 165. The detection unit 164 thus transmits data to the control unit 165 by superposing the data on the signal generated in the coil L1. The data corresponds to the effective values Vrms, Irms, and Prms, and the signal ZX indicating the zero cross timing.

The control unit 165 extracts data from the signal that is generated in the coil L2 due to the detection unit 164 superposing the data on the signal generated in the coil L1. Specifically, the control unit 165 reads the data from the detection unit 164 by detecting a change in the signal that is generated in the coil L2 due to the detection unit 164 changing the impedance of the coil L1 in superposing the data on the signal generated in the coil L1.

In such a manner, the detection unit 164 transmits data to the control unit 165 electromagnetically coupled by the antenna ANT. In other words, the detection unit 164 transmits the data to the control unit 165 by wireless communication between the coils L1 and L2.

Configuration of Antenna ANT

Figure 8:
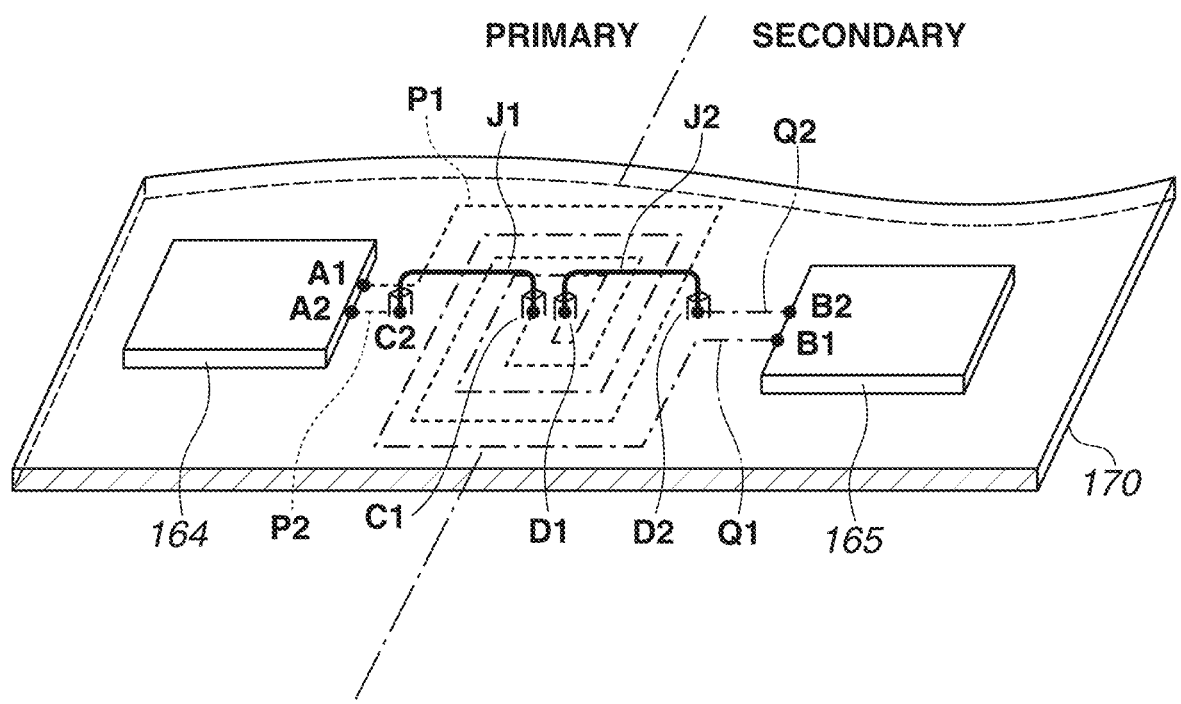
FIG. 8 is a diagram illustrating a configuration of an antenna according to the first exemplary embodiment.

Next, a configuration of the antenna ANT will be described. FIG. 8 is a diagram illustrating a configuration of the antenna ANT according to the present exemplary embodiment. In FIG. 8, components other than those included in the detection unit 164, the control unit 165, and the antenna ANT are omitted.

In the following description, the surface of a circuit substrate 170 where the detection unit 164 is disposed will be referred to as a first surface. The surface of the circuit substrate 170 opposite from the first surface will be referred to as a second surface.

The coil L1 according to the present exemplary embodiment includes wiring traces P1 and P2 (broken lines) formed on the first surface of the circuit substrate 170 including the AC driver 160, and a jumper portion J1 made of a conductor wire, for example. One end of the wiring trace P1 is electrically connected to a connection portion A1 of the detection unit 164. The wiring trace P1 is spirally formed up to a point C1 that is a connection portion with the jumper portion J1. One end of the wiring trace P2 is electrically connected to a connection portion A2 of the detection unit 164. The wiring trace P2 is formed up to a point C2 that is a connection portion with the jumper portion J1. The spiral shape may include not only a shape formed by straight lines as illustrated in FIG. 8 but also a shape formed by a curved line.

The jumper portion J1 electrically connecting the points C1 and C2 includes vertical portions extending vertically (in a direction intersecting the first surface) and a horizontal portion extending horizontally (in a direction parallel to the first surface). In other words, the jumper portion J1 is disposed to not contact the wiring traces P1 and P2 except at the points C1 and C2. The jumper portion J1 is disposed to not contact the coil L2, either. In the present exemplary embodiment, the jumper portion J1 has a shape made of straight lines. However, the jumper portion J1 may be shaped to an arched curve, for example.

The coil L2 according to the present exemplary embodiment includes wiring traces Q1 and Q2 (dot-dashed lines) formed on the first surface, and a jumper portion J2 made of a conductor wire, for example. One end of the wiring trace Q1 is electrically connected to a connection portion B1 of the control unit 165. The wiring trace Q1 is spirally formed up to a point D1 that is a connection portion with the jumper portion J2. One end of the wiring trace Q2 is electrically connected to a connection portion B2 of the control unit 165. The wiring trace Q2 is formed up to a point D2 that is a connection portion with the jumper portion J2.

The jumper portion J2 electrically connecting the points D1 and D2 includes vertical portions extending vertically and a horizontal portion extending horizontally. In other words, the jumper portion J2 is disposed to not contact the wiring traces Q1 and Q2 except at the points D1 and D2. The jumper portion J2 is disposed to not contact the coil L1, either. In the present exemplary embodiment, the jumper portion J2 has a shape made of straight lines. However, the jumper portion J2 may be shaped to an arched curve, for example.

As described above, the coils L1 and L2 are disposed to not contact each other.

With such a configuration, the coils L1 and L2 are insulated from each other. As a result, the detection unit 164 disposed in the first circuit 160a is insulated from the control unit 165 disposed in the second circuit 160b, and electromagnetically coupled to the control unit 165 by the antenna ANT including the coils L1 and L2. Specifically, an AC voltage is generated in the coil L1 by an AC magnetic field that is generated in the coil L2 due to the AC current flowing through the coil L2 based on the signal output by the control unit 165. The detection unit 164 operates with the AC voltage generated in the coil L1. In the present exemplary embodiment, the detection unit 164 is thus powered by the control unit 165 via the antenna ANT. Since the first circuit 160a does not need a power supply for operating the detection unit 164, an increase in apparatus size and cost can be avoided while maintaining the first and second circuits 160a and 160b insulated.

In the present exemplary embodiment, the detection unit 164 transmits data to the control unit 165, for example, by changing the impedance of the coil L1 to change the signal generated in the coil L1. The control unit 165 reads the data from the detection unit 164 by detecting the change. In such a manner, the detection unit 164 transmits the data to the control unit 165 electromagnetically coupled by the antenna ANT. Since no transformer is needed between the first and second circuits 160a and 160b, an increase in apparatus size and cost can be avoided while maintaining the first and second circuits 160a and 160b insulated.

The spiral shapes of the coils L1 and L2 according to the present exemplary embodiment are formed by wiring traces. However, this is not restrictive. For example, the spiral shapes may be formed by conductor wires.

In the present exemplary embodiment, the detection unit 164, the control unit 165, and the coils L1 and L2 are formed on the first surface of the circuit substrate 170. However, this is not restrictive. For example, the detection unit 164 and the coil L1 may be formed on the first surface of the circuit substrate 170 while the control unit 165 and the coil L2 are formed on the second surface opposite from the first surface. The detection unit 164 and the control unit 165 may be disposed on the first surface while the coil L1 is formed on the first surface and the coil L2 is formed on the second surface. The detection unit 164 and the control unit 165 may be disposed on the first surface while the coil L2 is formed on the first surface and the coil L1 is formed on the second surface. Wiring traces formed on the second surface are electrically connected to wiring traces disposed on the first surface and circuits such as the detection unit 164 and the control unit 165 via traces disposed in openings in the circuit substrate 170, for example. The wiring traces formed on the second surface may be electrically connected to the wiring traces disposed on the first surface and the circuits such as the detection unit 164 and the control unit 165 by conductor wires and solder via openings in the circuit substrate 170, for example.

Figure 9:
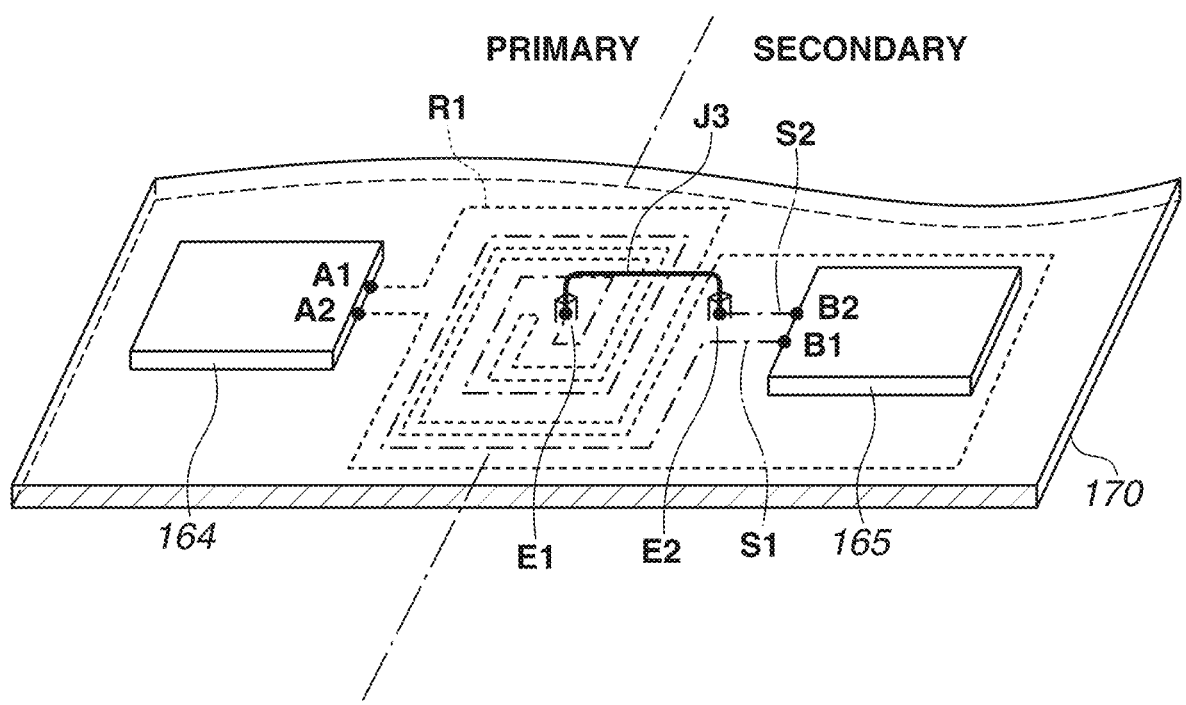
FIG. 9 is a diagram illustrating another configuration of the antenna according to the first exemplary embodiment.

In the present exemplary embodiment, the coils L1 and L2 are formed by using the jumper portions J1 and J2. However, this is not restrictive. For example, as illustrated in FIG. 9, one end of a wiring trace R1 spirally formed on the first surface is electrically connected to the connection portion A1. The other end of the wiring trace R1 is electrically connected to the connection portion A2. In other words, the connection portion A1 and A2 are electrically connected by a single wiring trace R1. Moreover, one end of a wiring trace S1 is electrically connected to the connection portion B1 of the control unit 165. The wiring trace S1 is spirally formed up to a point E1 that is a connection portion with a jumper portion J3. One end of a wiring trace S2 is electrically connected to the connection portion B2 of the control unit 165. The wiring trace S2 is formed up to a point E2 that is a connection portion with the jumper portion J3. Such a configuration may be employed.

An image forming apparatus 100 according to a second exemplary embodiment of the present invention will now be described. A description of components of the image forming apparatus 100 similar to those of the first exemplary embodiment will be omitted.

Configuration of Antenna ANT

Figure 10:
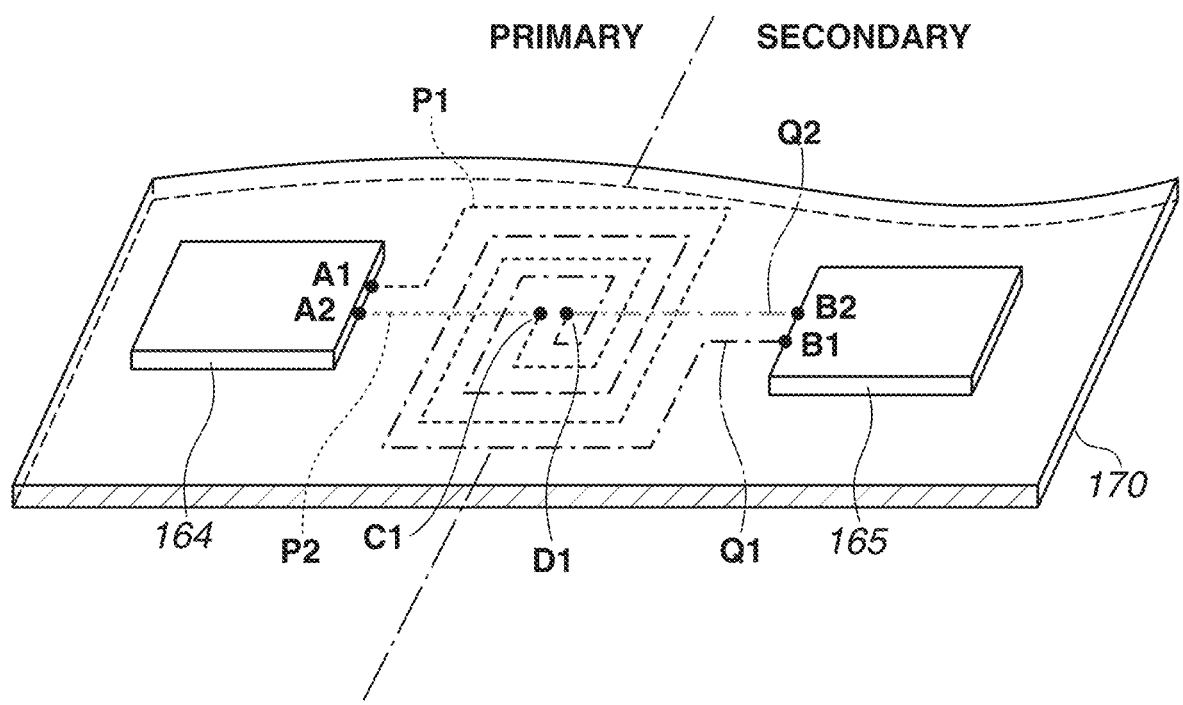
FIG. 10 is a diagram illustrating a configuration of an antenna according to a second exemplary embodiment.

FIG. 10 is a diagram illustrating a configuration of an antenna ANT according to the present exemplary embodiment. In FIG. 10, components other than those included in the detection unit 164, the control unit 165, and the antenna ANT are omitted. In FIG. 10, wiring traces formed on the second surface are illustrated in gray.

As illustrated in FIG. 10, in the present exemplary embodiment, a wiring trace P1 formed on the first surface is electrically connected to a wiring trace P2 formed on the second surface at a point C1. A wiring trace Q1 formed on the first surface is electrically connected to a wiring trace Q2 formed on the second surface at a point D1.

The wiring traces disposed on the second surface are electrically connected to the wiring traces disposed on the first surface and the circuits such as the detection unit 164 via traces disposed in openings in the circuit substrate 170, for example. The wiring traces disposed on the second surface may be electrically connected to the wiring traces disposed on the first surface and the circuits such as the detection unit 164 and the control unit 165 by conductor wires or solder via the openings in the circuit substrate 170, for example.

As described above, the coils L1 and L2 are disposed to not contact each other.

With such a configuration, the coils L1 and L2 are insulated from each other. As a result, the detection unit 164 disposed in the first circuit 160a is insulated from the control unit 165 disposed in the second circuit 160b, and electromagnetically coupled to the control unit 165 by the antenna ANT including the coils L1 and L2. Specifically, an AC voltage is generated in the coil L1 by an AC magnetic field that is generated in the coil L2 due to an AC current flowing through the coil L2 based on a signal output by the control unit 165. The detection unit 164 operates with the AC voltage generated in the coil L1. In the present exemplary embodiment, the detection unit 164 is thus powered by the control unit 165 via the antenna ANT. Since the first circuit 160a does not need a power supply for operating the detection unit 164, an increase in apparatus size and cost can be avoided while maintaining the first and second circuits 160a and 160b insulated.

In the present exemplary embodiment, the detection unit 164 transmits data to the control unit 165, for example, by changing the impedance of the coil L1 to change the signal generated in the coil L1. The control unit 165 reads the data from the detection unit 164 by detecting the change. In such a manner, the detection unit 164 transmits the data to the control unit 165 electromagnetically coupled by the antenna ANT. Since no transformer is needed between the first and second circuits 160a and 160b, an increase in apparatus size and cost can be avoided while maintaining the first and second circuits 160a and 160b insulated.

In the present exemplary embodiment, the wiring trace P1 formed on the first surface is electrically connected to the wiring trace P2 formed on the second surface at the point C1, and the wiring trace Q1 formed on the first surface is electrically connected to the wiring trace Q2 formed on the second surface at the point D1. However, this is not restrictive. For example, the wiring trace P1 formed on the second surface may be electrically connected to the wiring trace P2 formed on the first surface at the point C1, and the wiring trace Q1 formed on the second surface may be electrically connected to the wiring trace Q2 formed on the first surface at the point D1.

Figure 11:
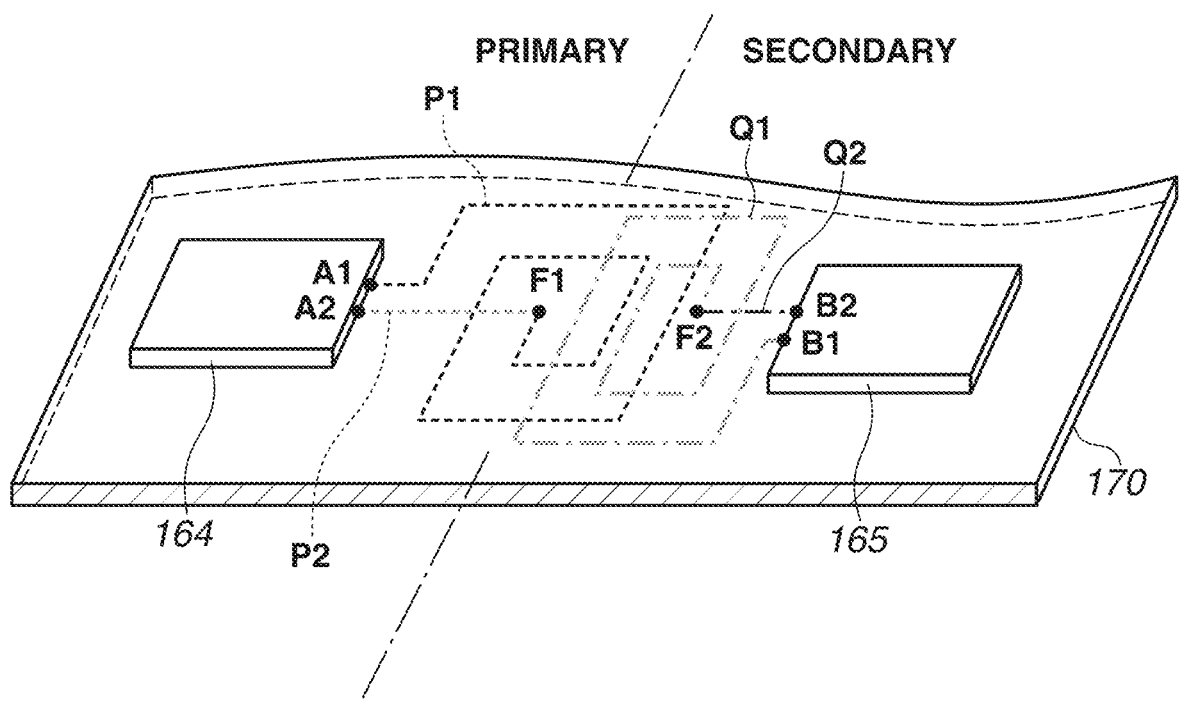
FIG. 11 is a diagram illustrating another configuration of the antenna according to the second exemplary embodiment.

As another example, a configuration illustrated in FIG. 11 may be employed. Specifically, the wiring trace P1 formed on the first surface may be electrically connected to the wiring trace P2 formed on the second surface at a point F1, and the wiring trace Q1 formed on the second surface may be electrically connected to the wiring trace Q2 formed on the first surface at a point F2. Alternatively, the wiring trace P1 formed on the second surface may be electrically connected to the wiring trace P2 formed on the first surface at the point F1, and the wiring trace Q1 formed on the first surface may be electrically connected to the wiring trace Q2 formed on the second surface at the point F2. In FIG. 11, the wiring traces formed on the second surface are illustrated in gray.

Figure 12:
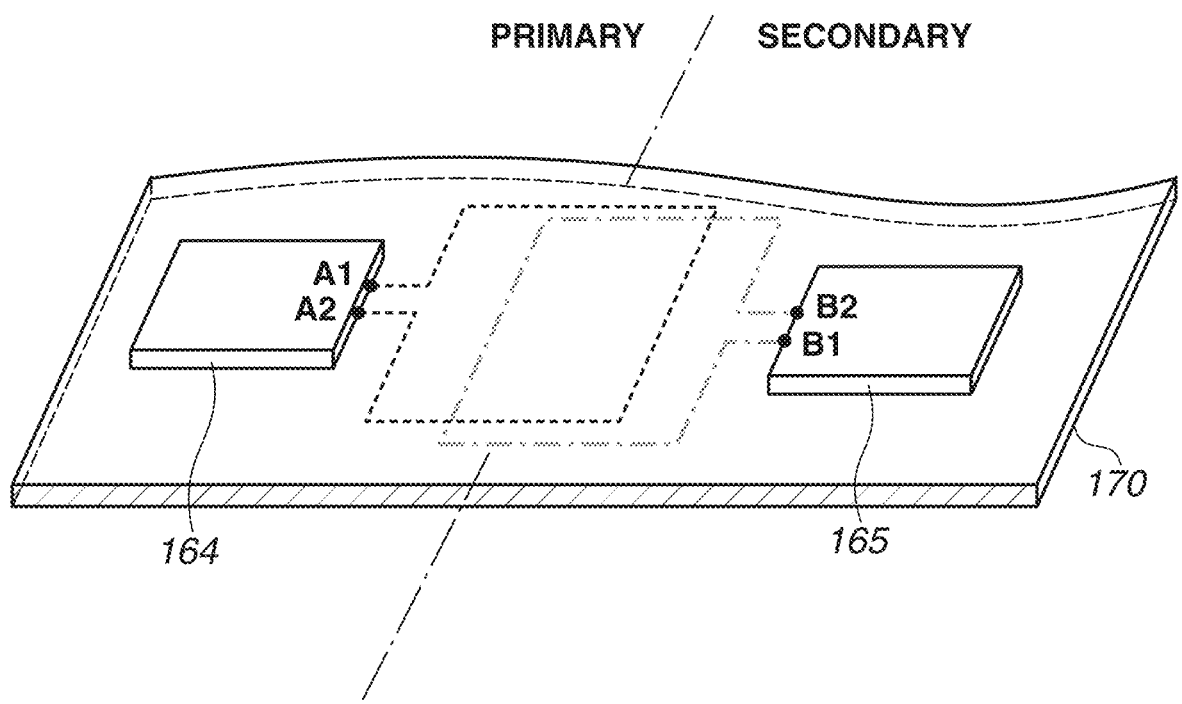
FIG. 12 is a diagram illustrating another configuration of the antenna according to the second exemplary embodiment.

In the first and second exemplary embodiments, the coils L1 and L2 are spirally formed. However, this is not restrictive. For example, as illustrated in FIG. 12, the coils L1 and L2 each may include a single turn of wiring trace two-dimensionally arranged to constitute an antenna. In FIG. 12, the wiring trace formed on the second surface is illustrated in gray.

As illustrated in FIGS. 8 to 11, the coils L1 and L2 according to the first and second exemplary embodiments can be configured so that at least a part of the range (region) of the coil L1 from the center to the periphery of the spiral overlaps the range (region) of the coil L2 from the center to the periphery of the spiral when seen in a direction perpendicular to the first surface.

In the present exemplary embodiment, the surface where the control unit 165 is disposed may be the first surface or the second surface.

An image forming apparatus 100 according to a third exemplary embodiment of the present invention will now be described. A description of components of the image forming apparatus 100 similar to those of the first exemplary embodiment will be omitted.

Configuration of Antenna ANT

Figure 13:
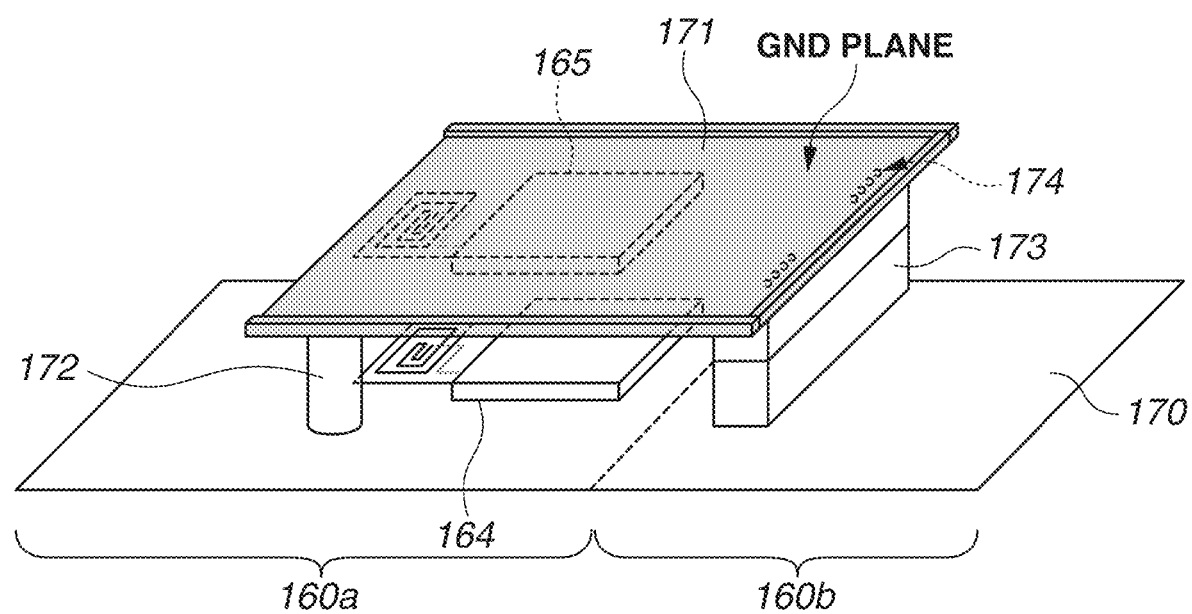
FIG. 13 is a diagram illustrating a configuration of an antenna according to a third exemplary embodiment.

FIG. 13 is a diagram illustrating a configuration of an antenna ANT according to the present exemplary embodiment. In FIG. 13, components other than those included in the detection unit 164, the control unit 165, and the antenna ANT are omitted.

In the present exemplary embodiment, the first circuit 160a includes the detection unit 164 and the coil L1 disposed on the circuit substrate 170. The coil L1 has a configuration similar to one of those described in the first and second exemplary embodiments, for example.

In the present exemplary embodiment, the control unit 165 and the coil L2 are disposed on a circuit substrate 171. The coil L2 has a configuration similar to one of those described in the first and second exemplary embodiments, for example.

The circuits disposed on the circuit substrate 171 are electrically connected to the circuits disposed on the circuit substrate 170 by connection portions 174 disposed on the circuit substrate 171 and a connector 173. The surface of the circuit substrate 171 opposite from where the control unit 165 is disposed is constituted by a GND plane and grounded.

In the present exemplary embodiment, a predetermined gap is formed between the circuit substrates 170 and 171 by spacers 172 and the connector 173 located between the circuit substrates 170 and 171. The circuit substrates 171 and 170 are opposed to each other.

The coils L1 and L2 are arranged so that at least a part of the range of the coil L1 from the center to the periphery of the spiral overlaps the range of the coil L2 from the center to the periphery of the spiral when seen in a direction perpendicular to the first surface.

With such a configuration, the coils L1 and L2 are insulated from each other. As a result, the detection unit 164 disposed in the first circuit 160a is insulated from the control unit 165 disposed in the second circuit 160b, and electromagnetically coupled to the control unit 165 by the antenna ANT including the coils L1 and L2. Specifically, an AC voltage is generated in the coil L1 by an AC magnetic field that is generated in the coil L2 due to an AC current flowing through the coil L2 based on a signal output by the control unit 165. The detection unit 164 operates with the AC voltage generated in the coil L1. In the present exemplary embodiment, the detection unit 164 is thus powered by the control unit 165 via the antenna ANT. Since the first circuit 160a does not need a power supply for operating the detection unit 164, an increase in apparatus size and cost can be avoided while maintaining the first and second circuits 160a and 160b insulated.

In the present exemplary embodiment, the detection unit 164 transmits data to the control unit 165, for example, by changing the impedance of the coil L1 to change the signal generated in the coil L1. The control unit 165 reads the data from the detection unit 164 by detecting the change. In such a manner, the detection unit 164 transmits the data to the control unit 165 electromagnetically coupled by the antenna ANT. Since no transformer is needed between the first and second circuits 160a and 160b, an increase in apparatus size and cost can be avoided while maintaining the first and second circuits 160a and 160b insulated.

In the present exemplary embodiment, the length of the spacers 172 in the vertical direction is the same as that of the connector 173 in the vertical direction. However, this is not restrictive.

An image forming apparatus 100 according to a fourth exemplary embodiment of the present invention will now be described. A description of components of the image forming apparatus 100 similar to those of the first exemplary embodiment will be omitted.

Configuration of Antenna ANT

Figure 14:
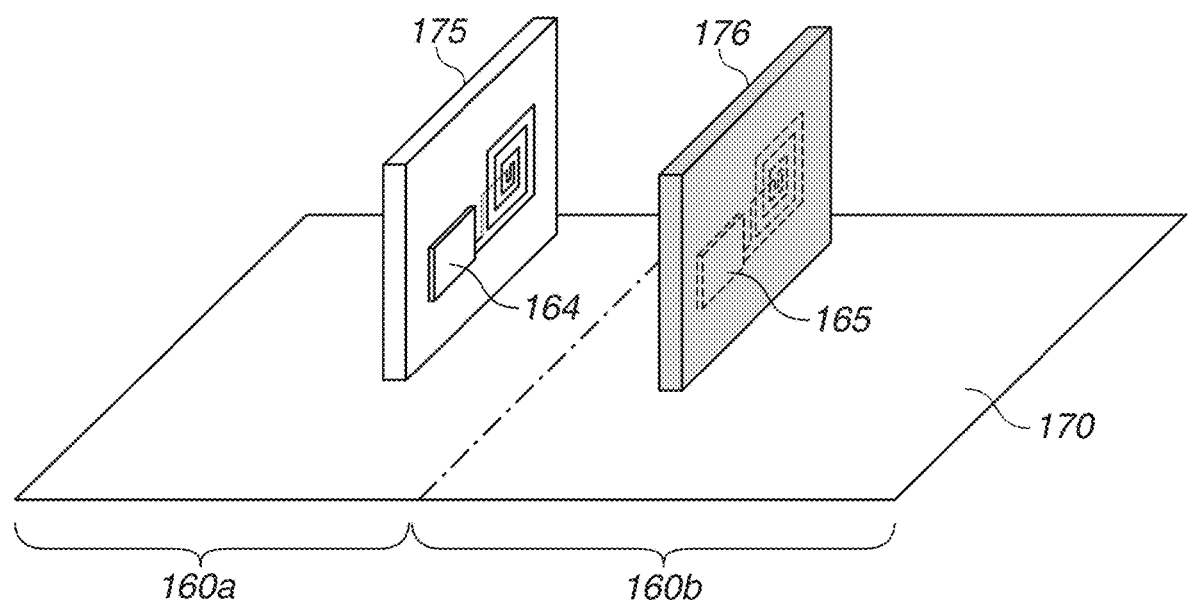
FIG. 14 is a diagram illustrating a configuration of an antenna according to a fourth exemplary embodiment.

FIG. 14 is a diagram illustrating a configuration of an antenna ANT according to the present exemplary embodiment. In FIG. 14, components other than those included in the detection unit 164, the control unit 165, and the antenna ANT are omitted.

In the present exemplary embodiment, the first circuit 160a includes a circuit substrate 175 on which the detection unit 164 and the coil L1 are disposed. Specifically, the circuit substrate 175 is disposed so that the surface of the circuit substrate 175 where the coil L1 is disposed intersects the surface of the circuit substrate 170 where circuits are mounted. The detection unit 164 is electrically connected to the circuitry of the first circuit 160a on the circuit substrate 170 by not-illustrated wiring.

Moreover, in the present exemplary embodiment, the second circuit 160b includes a circuit substrate 176 on which the control unit 165 and the coil L2 are disposed. Specifically, the circuit substrate 176 is disposed so that the surface of the circuit substrate 176 where the coil L2 is disposed intersects the surface of the circuit substrate 170 where circuits are mounted. The control unit 165 is electrically connected to the circuitry of the second circuit 160b on the circuit substrate 170 by not-illustrated wiring.

The coils L1 and L2 have a configuration similar to one of those described in the first and second exemplary embodiments, for example.

As illustrated in FIG. 14, the circuit substrates 175 and 176 are disposed so that the surface where the coil L1 is disposed and the surface where the coil L2 is disposed are opposed to each other. The coils L1 and L2 are located so that at least a part of the range of the coil L1 from the center to the periphery of the spiral overlaps the range of the coil L2 from the center to the periphery of the spiral when seen in a direction perpendicular to the surface where the coil L1 is disposed.

With such a configuration, the coils L1 and L2 are insulated from each other. As a result, the detection unit 164 disposed in the first circuit 160a is insulated from the control unit 165 disposed in the second circuit 160b, and electromagnetically coupled to the control unit 165 by the antenna ANT including the coils L1 and L2. Specifically, an AC voltage is generated in the coil L1 by an AC magnetic field that is generated in the coil L2 due to an AC current flowing through the coil L2 based on a signal output by the control unit 165. The detection unit 164 operates with the AC voltage generated in the coil L1. In the present exemplary embodiment, the detection unit 164 is thus powered by the control unit 165 via the antenna ANT. Since the first circuit 160a does not need a power supply for operating the detection unit 164, an increase in apparatus size and cost can be avoided while maintaining the first and second circuits 160a and 160b insulated.

In the present exemplary embodiment, the detection unit 164 transmits data to the control unit 165, for example, by changing the impedance of the coil L1 to change the signal generated in the coil L1. The control unit 165 reads the data from the detection unit 164 by detecting the change. In such a manner, the detection unit 164 transmits the data to the control unit 165 electromagnetically coupled by the antenna ANT. Since no transformer is needed between the first and second circuits 160a and 160b, an increase in apparatus size and cost can be avoided while maintaining the first and second circuits 160a and 160b insulated.

An image forming apparatus 100 according to a fifth exemplary embodiment of the present invention will be described. A description of components of the image forming apparatus 100 similar to those of the first exemplary embodiment will be omitted.

Configuration of Antenna ANT

Figure 15:
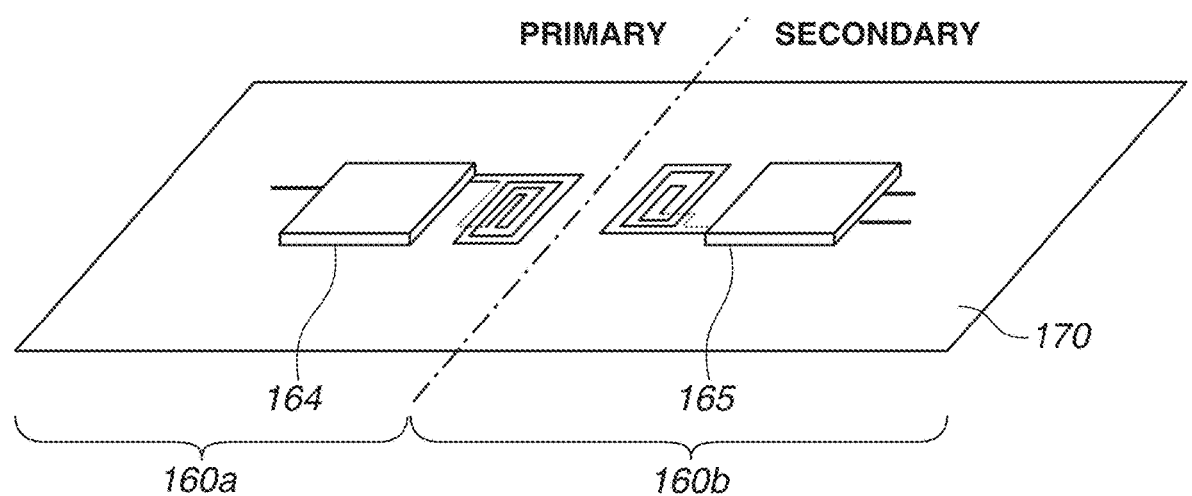
FIG. 15 is a diagram illustrating a configuration of an antenna according to a fifth exemplary embodiment.

FIG. 15 is a diagram illustrating a configuration of an antenna ANT according to the present exemplary embodiment. In FIG. 15, components other than those included in the detection unit 164, the control unit 165, and the antenna ANT are omitted.

In the present exemplary embodiment, the first circuit 160a includes the detection unit 164 and the coil L1 disposed on the circuit substrate 170. The second circuit 160b includes the control unit 165 and the coil L2. In the present exemplary embodiment, the coil L2 is located at a distance where the coil L2 can be electromagnetically coupled to the coil L1. The coils L1 and L2 have a configuration similar to one of those described in the first and second exemplary embodiments, for example.

With such a configuration, the coils L1 and L2 are insulated from each other. As a result, the detection unit 164 disposed in the first circuit 160a is insulated from the control unit 165 disposed in the second circuit 160b, and electromagnetically coupled to the control unit 165 by the antenna ANT including the coils L1 and L2. Specifically, an AC voltage is generated in the coil L1 by an AC magnetic field that is generated in the coil L2 due to an AC current flowing through the coil L2 based on a signal output by the control unit 165. The detection unit 164 operates with the AC voltage generated in the coil L1. In the present exemplary embodiment, the detection unit 164 is thus powered by the control unit 165 via the antenna ANT. Since the first circuit 160a does not need a power supply for operating the detection unit 164, an increase in apparatus size and cost can be avoided while maintaining the first and second circuits 160a and 160b insulated.

In the present exemplary embodiment, the detection unit 164 transmits data to the control unit 165, for example, by changing the impedance of the coil L1 to change the signal generated in the coil L1. The control unit 165 reads the data from the detection unit 164 by detecting the change. In such a manner, the detection unit 164 transmits the data to the control unit 165 electromagnetically coupled by the antenna ANT. Since no transformer is needed between the first and second circuits 160a and 160b, an increase in apparatus size and cost can be avoided while maintaining the first and second circuits 160a and 160b insulated.

An image forming apparatus 100 according to a sixth exemplary embodiment of the present invention will be described. A description of components of the image forming apparatus 100 similar to those of the first exemplary embodiment will be omitted.

Configuration of Antenna ANT

Figure 16:
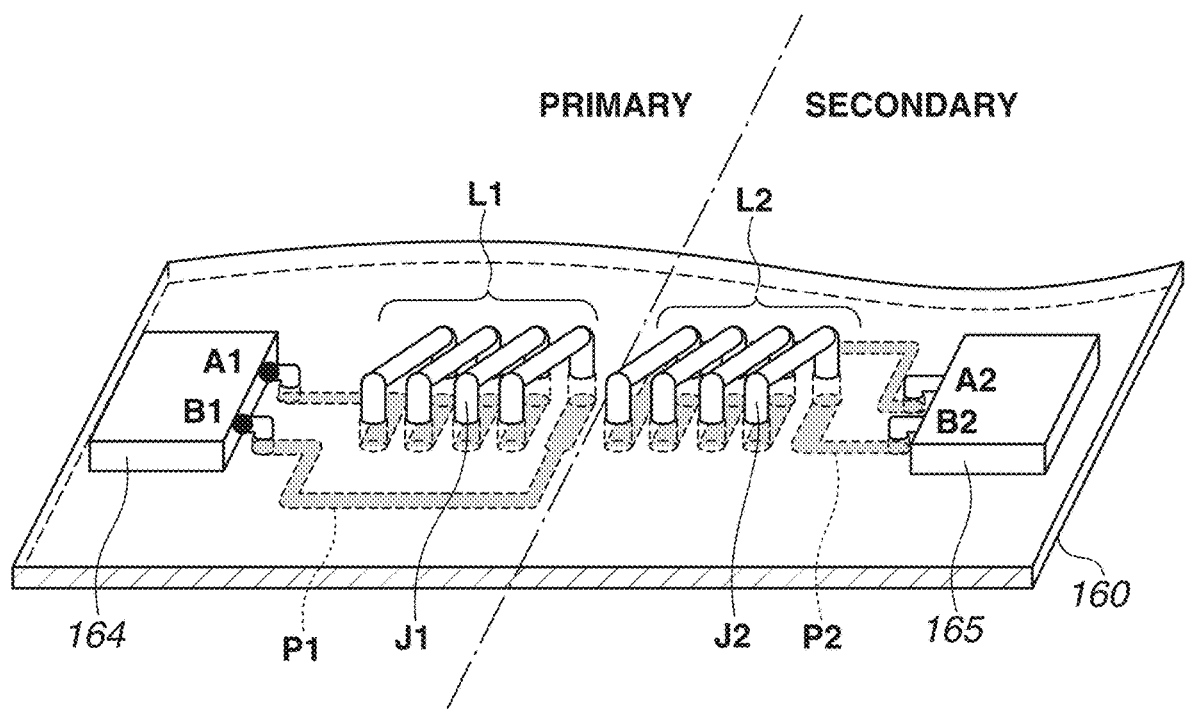
FIG. 16 is a diagram illustrating a configuration of an antenna according to a sixth exemplary embodiment.

FIG. 16 is a diagram illustrating a configuration of an antenna ANT according to the present exemplary embodiment. In FIG. 16, components other than those included in the detection unit 164, the control unit 165, and the antenna ANT are omitted.

In the present exemplary embodiment, as illustrated in FIG. 16, the coil L1 includes a plurality of jumper portions J1 disposed on the first surface and wiring traces P1 formed on the second surface. The connection portion A1 of the detection unit 164 is connected to one end of the coil L1, and the connection portion B1 of the detection unit 164 is connected to the other end of the coil L1. In the present exemplary embodiment, the jumper portions J1 have a shape made of straight lines. However, the jumper portions J1 may be shaped to an arched curve, for example.

In the present exemplary embodiment, as illustrated in FIG. 16, the coil L2 includes a plurality of jumper portions J2 disposed on the first surface and wiring traces P2 formed on the second surface. The connection portion A2 of the control unit 165 is connected to one end of the coil L2, and the connection portion B2 of the control unit 165 is connected to the other end of the coil L2. In the present exemplary embodiment, the jumper portions J2 have a shape made of straight lines. However, the jumper portions J2 may be shaped to an arched curve, for example.

The wiring traces P1 and the wiring traces P2 are disposed to not contact each other.

With such a configuration, the coils L1 and L2 are insulated from each other. As a result, the detection unit 164 disposed in the first circuit 160a is insulated from the control unit 165 disposed in the second circuit 160b, and electromagnetically coupled to the control unit 165 by the antenna ANT including the coils L1 and L2. Specifically, an AC voltage is generated in the coil L1 by an AC magnetic field that is generated in the coil L2 due to an AC current flowing through the coil L2 based on a signal output by the control unit 165. The detection unit 164 operates with the AC voltage generated in the coil L1. In the present exemplary embodiment, the detection unit 164 is thus powered by the control unit 165 via the antenna ANT. Since the first circuit 160a does not need a power supply for operating the detection unit 164, an increase in apparatus size and cost can be avoided while maintaining the first and second circuits 160a and 160b insulated.

In the present exemplary embodiment, the detection unit 164 transmits data to the control unit 165, for example, by changing the impedance of the coil L1 to change the signal generated in the coil L1. The control unit 165 reads the data from the detection unit 164 by detecting the change. In such a manner, the detection unit 164 transmits the data to the control unit 165 electromagnetically coupled by the antenna ANT. Since no transformer is needed between the first and second circuits 160a and 160b, an increase in apparatus size and cost can be avoided while maintaining the first and second circuits 160a and 160b insulated.

The control unit 165 may be configured to have the functions of the CPU 151a according to the first to fifth exemplary embodiments. The CPU 151a may be configured to have the functions of the control unit 165.

The voltage V and the current I in the first to fifth exemplary embodiments correspond to parameters related to power supplied to a load.

The triac driving circuit 167a and the triac 167 according to the first to fifth exemplary embodiments are included in an adjustment unit and a triac circuit, respectively.

In the first to fifth exemplary embodiment, the CPU 151a obtains the effective values in response to the input of the signal ZX. However, this is not restrictive. For example, the CPU 151a may be configured to obtain the effective values when the time measured by a timer provided in the CPU 151a reaches a time corresponding to one cycle of the voltage V. In other words, the signal ZX does not need to be input to the CPU 151a from the control unit 165.

In the first to fifth exemplary embodiments, the triac 167 is used as a configuration for adjusting the power supplied to the heating element 161a. However, this is not restrictive. For example, the power supplied to the heating element 161a may be adjusted by changing the resistance of a circuit in the first circuit 160a to modulate the amplitudes of the voltage and the current supplied to the heating element 161a.

In the first to fifth exemplary embodiments, the detection unit 164 transmits data to the control unit 165 by changing the impedance of the coil L1 to modulate the amplitude of the signal generated in the coil L1. However, this is not restrictive. For example, the detection unit 164 may be configured to transmit data to the control unit 165 by modulating the frequency of the signal generated in the coil L1.

In the first to fifth exemplary embodiments, near-field communication (NFC) is used as a method for performing wireless communication between the detection unit 164 and the control unit 165. However, the method for performing wireless communication between the detection unit 164 and the control unit 165 is not limited thereto. For example, infrared communication may be used as the method for performing wireless communication between the detection unit 164 and the control unit 165.

In the first to fifth exemplary embodiments, the first circuit 160a is connected to the commercial power source. However, this is not restrictive. For example, the first circuit 160a may be configured to be connected to a predetermined power supply such as a battery.

The detection unit 164 and the coil L1 are included in a first communication unit. The detection unit 164 is included in a transmission unit. The coil L2 is included in a second communication unit. The resistor R3 is included in a detection device.

The present invention is not limited to the foregoing exemplary embodiments, and various changes and modifications may be made without departing from the spirit and scope of the present invention. The following claims are thus attached to make the scope of the present invention public.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A power supply apparatus comprising:
a first circuit connected to a predetermined power supply;
a second circuit insulated from the first circuit;
an adjustment unit included in the first circuit and configured to adjust power supplied from the predetermined power supply to a load connected to the first circuit;
a detection unit included in the first circuit and configured to detect a parameter related to the power supplied from the predetermined power supply to the load;
a first communication unit included in the first circuit and connected to the detection unit, the first communication unit including first wiring as a first antenna, the first wiring electrically connecting a first connection portion of the detection unit and a second connection portion of the detection unit;
a second communication unit included in the second circuit, and insulated from the first communication unit, the second communication unit including second wiring as a second antenna configured to perform wireless communication with the first antenna, the first wiring being disposed to not contact the second wiring; and
a control unit included in the second circuit and configured to control the adjustment unit based on a detection result of the detection unit, the second wiring electrically connecting a third connection portion of the control unit and a fourth connection portion of the control unit, the detection result being transmitted from the detection unit to the control unit by the wireless communication, the detection unit being configured to operate with power resulting from a voltage generated in the first communication unit due to a voltage output from the control unit to the second communication unit, wherein at least a part of a region surrounded by the first wiring and the detection unit overlaps a region surrounded by the second wiring and the control unit in a case where a circuit substrate is seen along a direction perpendicular to a surface of the circuit substrate where the detection unit is disposed, and wherein the second wiring is disposed on a second surface opposite from a first surface of the circuit substrate where the first wiring is disposed.

2. The power supply apparatus according to claim 1, wherein at least a part of the first wiring and the second wiring is a wiring trace formed on the surface of the circuit substrate.

3. The power supply apparatus according to claim 1, wherein wiring on the first surface of the circuit substrate is electrically connected to wiring on the second surface opposite from the first surface via an opening in the circuit substrate.

4. The power supply apparatus according to claim 1, wherein the first communication unit and the second communication unit are configured to perform the wireless communication using near-field communication (NFC).

5. The power supply apparatus according to claim 1, wherein the predetermined power supply is a commercial power source.

6. An image forming apparatus comprising:
the supply apparatus according to claim 1;
a heater serving as the load;
a second detection unit configured to detect a temperature of the heater;
a transfer unit configured to transfer a toner image to a sheet; and
a fixing unit configured to fix the toner image transferred to the sheet by the transfer unit to the sheet by using heat from the heater,
wherein the control unit is configured to control the power supplied to the heater so that a deviation between a target temperature of the heater and the temperature detected by the second detection unit decreases.

7. A power supply apparatus comprising:
a first circuit connected to a predetermined power supply;
a second circuit insulated from the first circuit;
an adjustment unit included in the first circuit and configured to adjust power supplied from the predetermined power supply to a load connected to the first circuit;
a detection unit included in the first circuit and configured to detect a parameter related to the power supplied from the predetermined power supply to the load;
a first communication unit included in the first circuit and connected to the detection unit, the first communication unit including first wiring as a first antenna, the first wiring electrically connecting a first connection portion of the detection unit and a second connection portion of the detection unit;
a second communication unit included in the second circuit, and insulated from the first communication unit, the second communication unit including second wiring as a second antenna configured to perform wireless communication with the first antenna, the first wiring being disposed to not contact the second wiring; and
a control unit included in the second circuit and configured to control the adjustment unit based on a detection result of the detection unit, the second wiring electrically connecting a third connection portion of the control unit and a fourth connection portion of the control unit, the detection result being transmitted from the detection unit to the control unit by the wireless communication, the detection unit being configured to operate with power resulting from a voltage generated in the first communication unit due to a voltage output from the control unit to the second communication unit, wherein at least a part of a region surrounded by the first wiring and the detection unit overlaps a region surrounded by the second wiring and the control unit in a case where a circuit substrate is seen along a direction perpendicular to a surface of the circuit substrate where the detection unit is disposed, and wherein the first wiring includes:
a first spiral portion spirally disposed on a first surface of the circuit substrate, and
a first wiring portion on a second surface opposite from the first surface, one end of the first spiral portion being connected to the first connection portion, the first wiring portion electrically connecting the other end of the first spiral portion to the second connection portion.

8. The power supply apparatus according to claim 7, wherein the second wiring includes
a second spiral portion spirally disposed on the first surface, and
a second wiring portion on the second surface, one end of the second spiral portion being connected to the third connection portion, the second wiring portion electrically connecting the other end of the second spiral portion to the fourth connection portion.

9. The power supply apparatus according to claim 7, wherein the second wiring includes
a second spiral portion spirally disposed on the second surface, and
a second wiring portion on the first surface, one end of the second spiral portion being connected to the third connection portion, the second wiring portion electrically connecting the other end of the second spiral portion to the fourth connection portion.

10. The power supply apparatus according to claim 7, wherein at least a part of the first wiring and the second wiring is a wiring trace formed on the surface of the circuit substrate.

11. The power supply apparatus according to claim 7, wherein wiring on the first surface of the circuit substrate is electrically connected to wiring on the second surface opposite from the first surface via an opening in the circuit substrate.

12. The power supply apparatus according to claim 7, wherein the first communication unit and the second communication unit are configured to perform the wireless communication using near-field communication (NFC).

13. The power supply apparatus according to claim 7, wherein the predetermined power supply is a commercial power source.

14. A communication unit device_comprising:
a substrate;
a first antenna disposed on the substrate; and
a second antenna disposed on the substrate, insulated from the first antenna, and configured to perform wireless communication with the first antenna, a region of the first antenna and at least a part of a region of a of the second antenna overlapping each other in a case where the first antenna and the second antenna are seen along a direction perpendicular to a surface of the substrate where the first antenna is disposed;
a transmitting unit connected to the first antenna and configured to transmit data; and
a receiving unit connected to the second antenna and configured to receive the data from the transmitting unit by the wireless communication.

15. The communication device according to claim 14, wherein the transmitting unit is configured to operate with power resulting from a voltage generated in the first antenna due to a voltage output from the receiving unit to the second antenna.

16. The communication device according to claim 15, wherein the transmitting unit and the receiving unit are disposed on the substrate.

17. The communication device according to claim 15, further comprising:
a first circuit including the first antenna and the transmitting unit, the first circuit being disposed on the substrate; and
a second circuit including the second antenna and the receiving unit, the second circuit being disposed on the substrate,
wherein the first circuit is insulated from the second circuit.

18. The communication device according to claim 15, wherein the first loop antenna includes:
a first spiral portion spirally printed on a first surface of the substrate, one end of the first spiral portion being connected to the transmitting unit, and
a first wiring portion printed on a second surface opposite from the first surface, the first wiring portion electrically connecting the other end of the first spiral portion to the transmitting unit.

19. The communication device according to claim 18, wherein the second antenna includes:
a second spiral portion spirally printed on the first surface, one end of the second spiral portion being connected to the receiving unit, and
a second wiring portion printed on the second surface, the second wiring portion electrically connecting the other end of the second spiral portion to the receiving unit.

20. The communication device according to claim 18, wherein the second loop antenna includes:
a second spiral portion spirally printed on the second surface, one end of the second spiral portion being connected to the receiving unit, and
a second wiring portion printed on the first surface, the second wiring portion electrically connecting the other end of the second spiral portion to the receiving unit.

21. The communication device according to claim 15, wherein the first antenna includes:
a first spiral portion spirally printed on a first surface of the substrate, one end of the first spiral portion being connected to the transmitting unit, and
a jumper portion, one end of the jumper portion electrically connecting to the other end of the first spiral portion at a first connecting point on the first surface, the other end of the jumper portion electrically connecting to the transmitting unit at a second connecting point on the first surface, and a portion of the jumper portion between the first connecting point and the second connecting point being located at a distance from the first surface.

22. The communication device according to claim 14, wherein the second loop antenna is printed on a second surface opposite from a first surface of the substrate where the first loop antenna is printed.

23. The communication device according to claim 14, wherein wiring in the first loop antenna printed on a first surface of the substrate is electrically connected to wiring in the first loop antenna printed on a second surface opposite from the first surface via an opening in the substrate.

24. The communication device according to claim 14, wherein the first loop antenna and the second loop antenna are configured to perform the wireless communication using near-field communication (NFC).

25. A power supply apparatus comprising:
the communication device according to claim 14, the first circuit being connected to a predetermined power supply;
a detector included in the transmitting unit, the detector being configured to detect a parameter related to a power supplied from the predetermined power supply to a load connected to the first circuit, and
a controller included in the receiving unit, the controller being configured to control the power supplied to the load based on a detection result of the detection unit as the data.

26. The power supply apparatus according to claim 25, wherein the predetermined power supply is a commercial power supply.

27. An image forming apparatus comprising:
the supply apparatus according to claim 25;
a heater serving as the load;
a second detector configured to detect a temperature of the heater; and
a fixing unit configured to fix a toner image on a sheet to the sheet by using heat from the heater,
wherein the controller is configured to control the power supplied to the heater based on the temperature detected by the second detector.

* * * * *